(12) United States Patent
Koh et al.

(10) Patent No.: US 12,009,363 B2
(45) Date of Patent: Jun. 11, 2024

(54) METHOD FOR FORMING SOURCE/DRAIN CONTACTS

(71) Applicant: Taiwan Semiconductor Manufacturing Co., Ltd., Hsin-Chu (TW)

(72) Inventors: Shao-Ming Koh, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 270 days.

(21) Appl. No.: 17/347,066

(22) Filed: Jun. 14, 2021

(65) Prior Publication Data
US 2021/0313324 A1  Oct. 7, 2021

Related U.S. Application Data

(62) Division of application No. 15/867,058, filed on Jan. 10, 2018, now Pat. No. 11,037,924.

(Continued)

(51) Int. Cl.
*H01L 27/092* (2006.01)
*H01L 21/02* (2006.01)
(Continued)

(52) U.S. Cl.
CPC ...... *H01L 27/092* (2013.01); *H01L 21/02057* (2013.01); *H01L 21/28525* (2013.01);
(Continued)

(58) Field of Classification Search
CPC ............... H01L 27/0886; H01L 27/092; H01L 27/0924; H01L 29/665; H01L 29/785;
(Continued)

(56) References Cited

U.S. PATENT DOCUMENTS 8,772,109 B2   7/2014  Colinge
8,785,285 B2   7/2014  Tsai et al.
(Continued)

OTHER PUBLICATIONS

Koh, Shao-Ming et al., "Method for Source/Drain Contact Formation in Semiconductor Devices", U.S. Appl. No. 15/686,698, filed Aug. 25, 2017, 38 pages.

*Primary Examiner* — Michael M Trinh
(74) *Attorney, Agent, or Firm* — Haynes and Boone, LLP

(57) ABSTRACT

Semiconductor devices and methods of forming the same are provided. In one embodiments, a semiconductor device includes an n-type transistor region and a p-type transistor region. The n-type transistor region includes a first gate stack, a first gate spacer over sidewalls of the first gate stack, an n-type epitaxial feature in a source/drain (S/D) region of the n-type transistor region, and a first metal silicide layer over the n-type epitaxial feature. The p-type transistor region includes a second gate stack, a second gate spacer over sidewalls of the second gate stack, a p-type epitaxial feature in an S/D region of the p-type transistor region, a dopant-containing implant layer over the p-type epitaxial feature, and a second metal silicide layer over the dopant-containing implant layer. The dopant-containing implant layer includes a metallic dopant.

20 Claims, 28 Drawing Sheets

Related U.S. Application Data

(60) Provisional application No. 62/589,080, filed on Nov. 21, 2017.

(51) Int. Cl.
| | | |
|---|---|---|
| *H01L 21/285* | (2006.01) | |
| *H01L 21/302* | (2006.01) | |
| *H01L 21/306* | (2006.01) | |
| *H01L 21/3065* | (2006.01) | |
| *H01L 21/311* | (2006.01) | |
| *H01L 21/4757* | (2006.01) | |
| *H01L 21/768* | (2006.01) | |
| *H01L 21/8234* | (2006.01) | |
| *H01L 21/8238* | (2006.01) | |
| *H01L 23/485* | (2006.01) | |
| *H01L 29/66* | (2006.01) | |
| *H01L 29/78* | (2006.01) | |
| *H01L 29/165* | (2006.01) | |
| *H01L 29/417* | (2006.01) | |

(52) U.S. Cl.
CPC ...... *H01L 21/302* (2013.01); *H01L 21/30608* (2013.01); *H01L 21/3065* (2013.01); *H01L 21/31138* (2013.01); *H01L 21/47573* (2013.01); *H01L 21/76801* (2013.01); *H01L 21/823418* (2013.01); *H01L 21/823437* (2013.01); *H01L 21/823814* (2013.01); *H01L 21/823821* (2013.01); *H01L 23/485* (2013.01); *H01L 27/0924* (2013.01); *H01L 29/7848* (2013.01); *H01L 29/165* (2013.01); *H01L 29/41791* (2013.01); *H01L 29/665* (2013.01)

(58) Field of Classification Search
CPC ....... H01L 29/66795; H01L 21/823821; H01L 21/823431; H01L 21/823871; H01L 21/823814; H01L 21/823418; H01L 21/823475; H01L 21/28525; H01L 21/26533; H01L 21/26506; H01L 21/26513
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,614,086 B1 | 4/2017 | Yeo et al. |
| 9,633,999 B1 | 4/2017 | Lu et al. |
| 2011/0223736 A1* | 9/2011 | Lin ............... H01L 29/66795 438/305 |
| 2015/0028423 A1* | 1/2015 | Park ............... H01L 21/823871 257/369 |
| 2016/0190133 A1* | 6/2016 | Wu ............... H01L 21/30604 257/369 |
| 2016/0260806 A1* | 9/2016 | Leobandung ....... H01L 29/0653 |
| 2017/0053804 A1 | 2/2017 | Lu et al. |
| 2017/0186748 A1 | 6/2017 | Lee et al. |
| 2017/0200824 A1* | 7/2017 | Yu ............... H01L 21/823864 |
| 2017/0213889 A1* | 7/2017 | Gluschenkov ....... H01L 29/665 |
| 2018/0286861 A1* | 10/2018 | Choi ............... H01L 21/76831 |

* cited by examiner

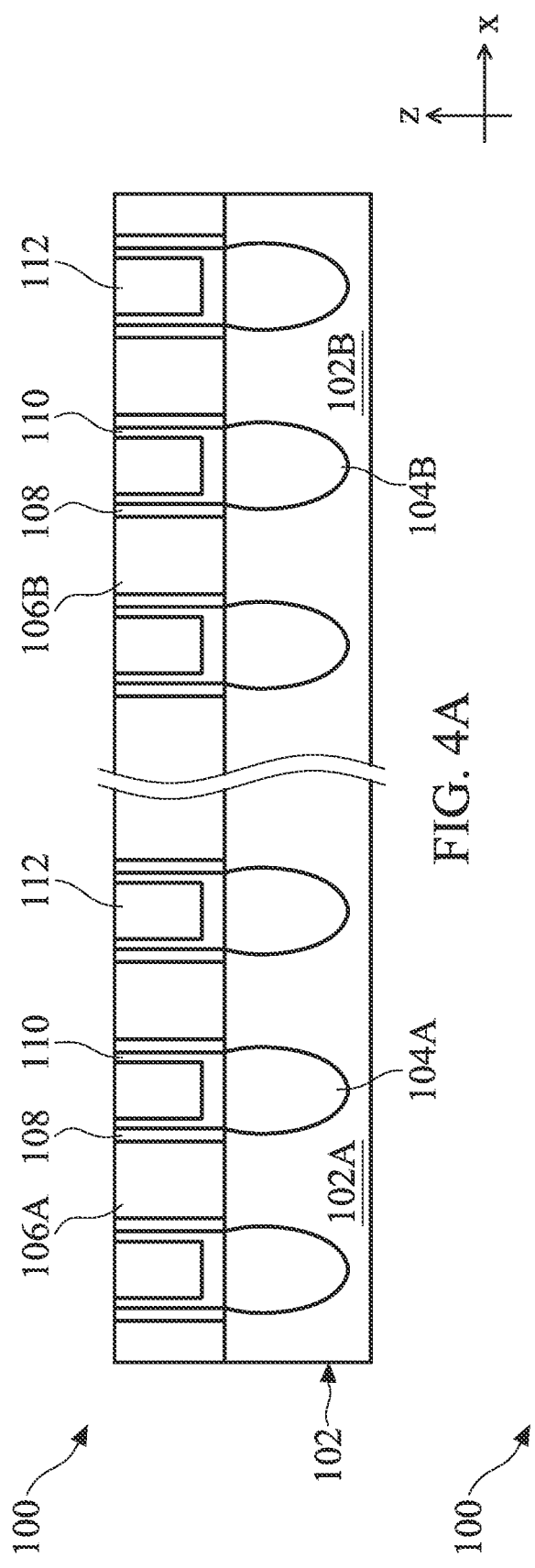
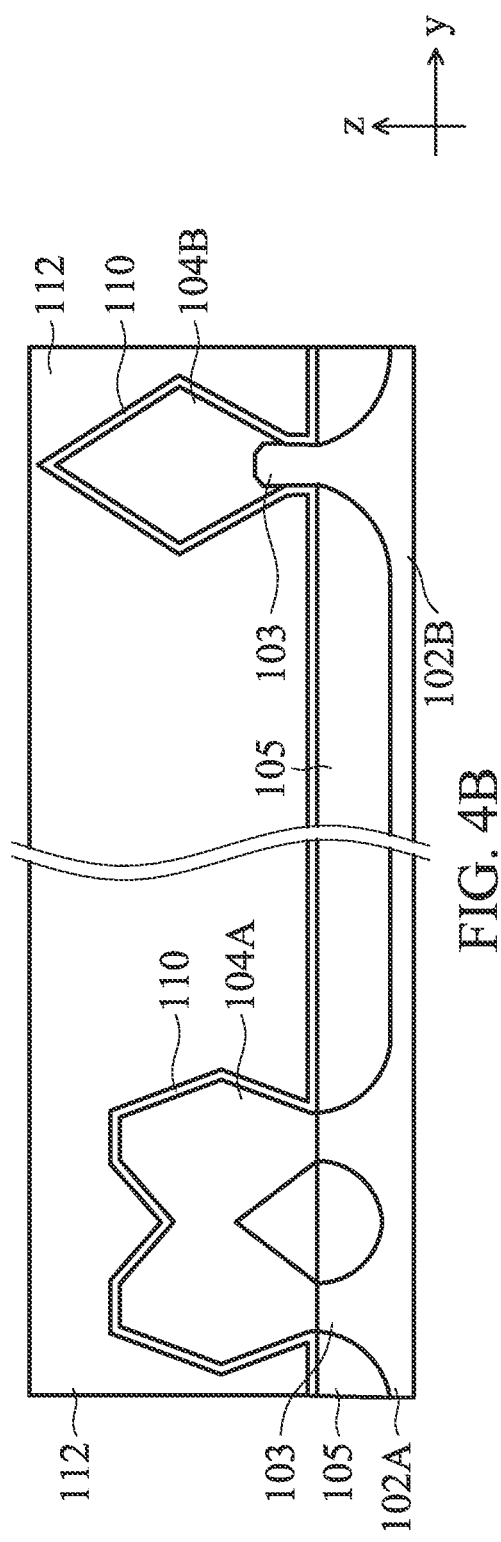
FIG. 4A
FIG. 4B

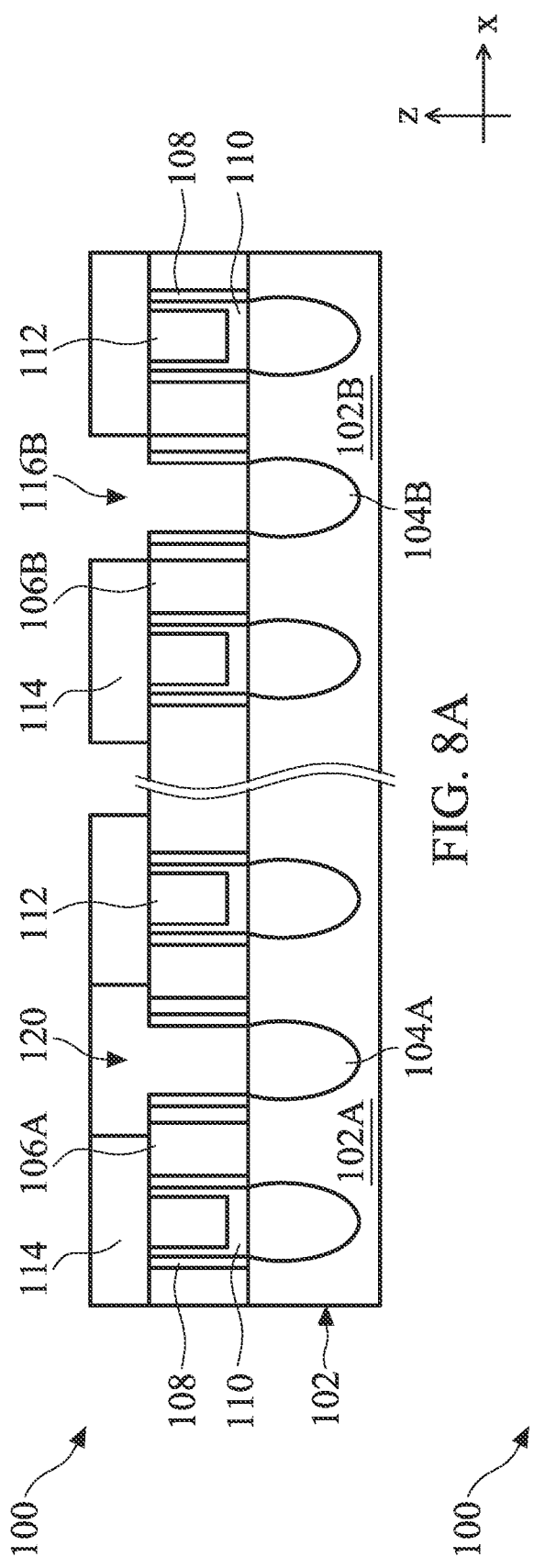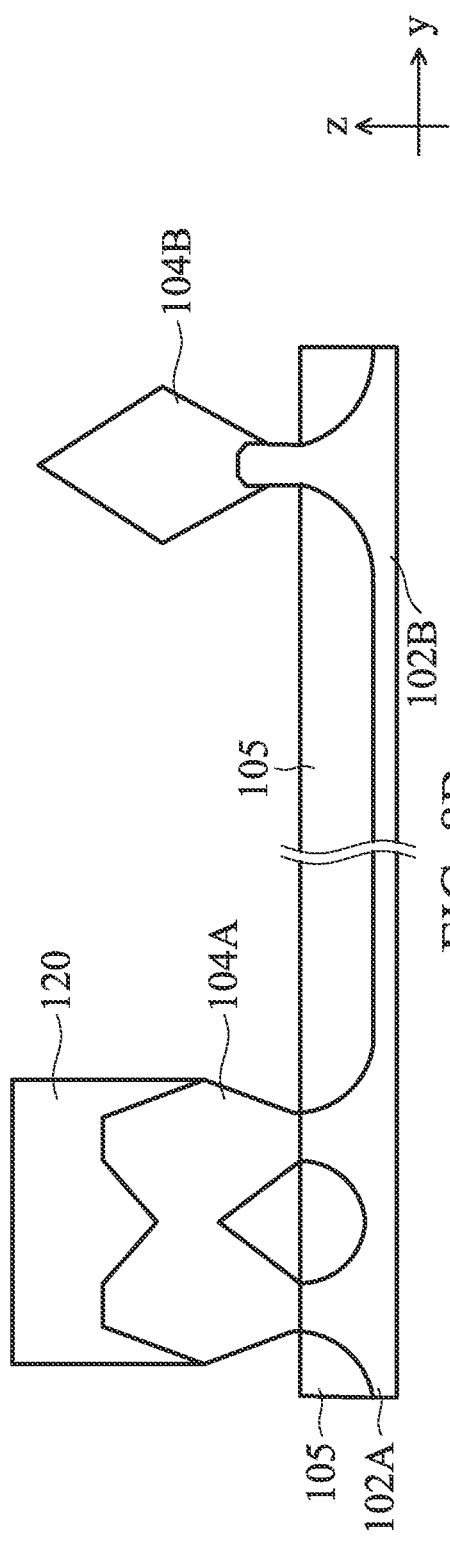

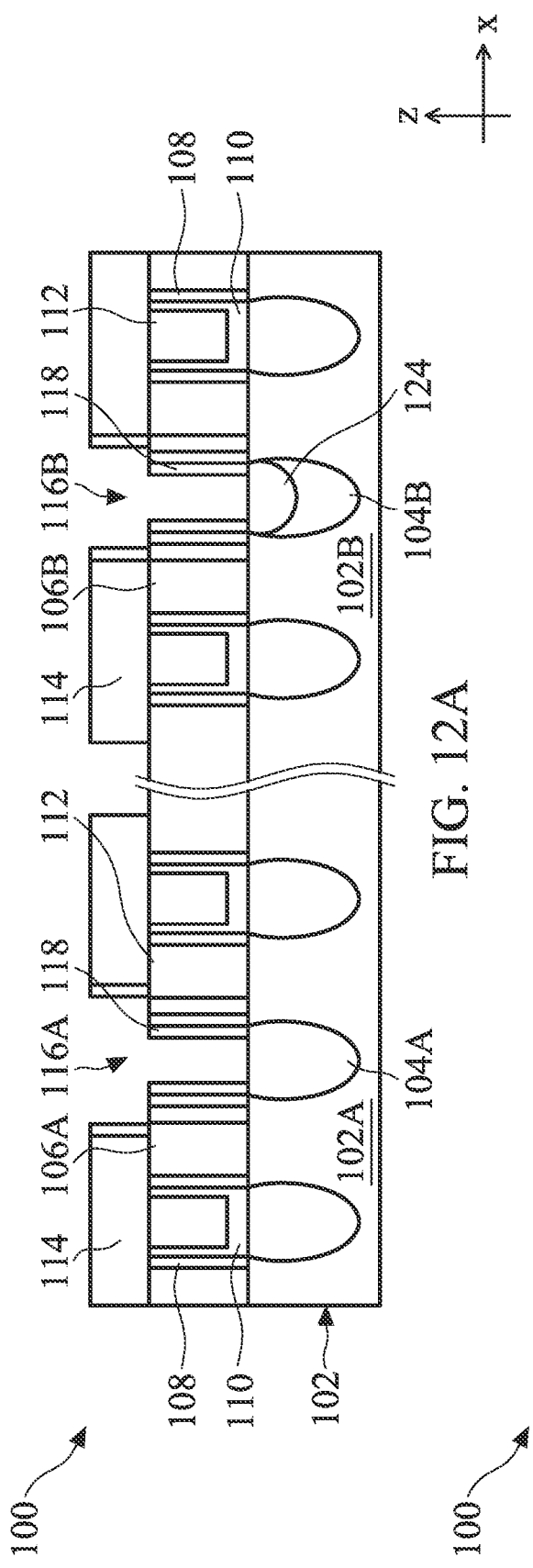
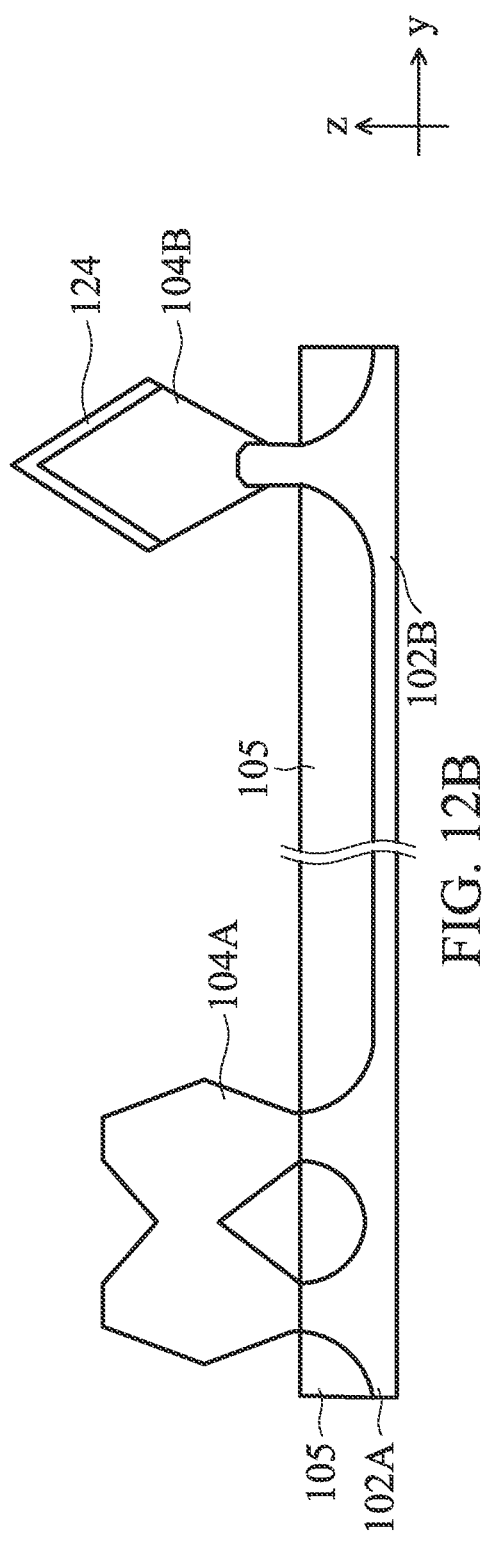
FIG. 12A
FIG. 12B

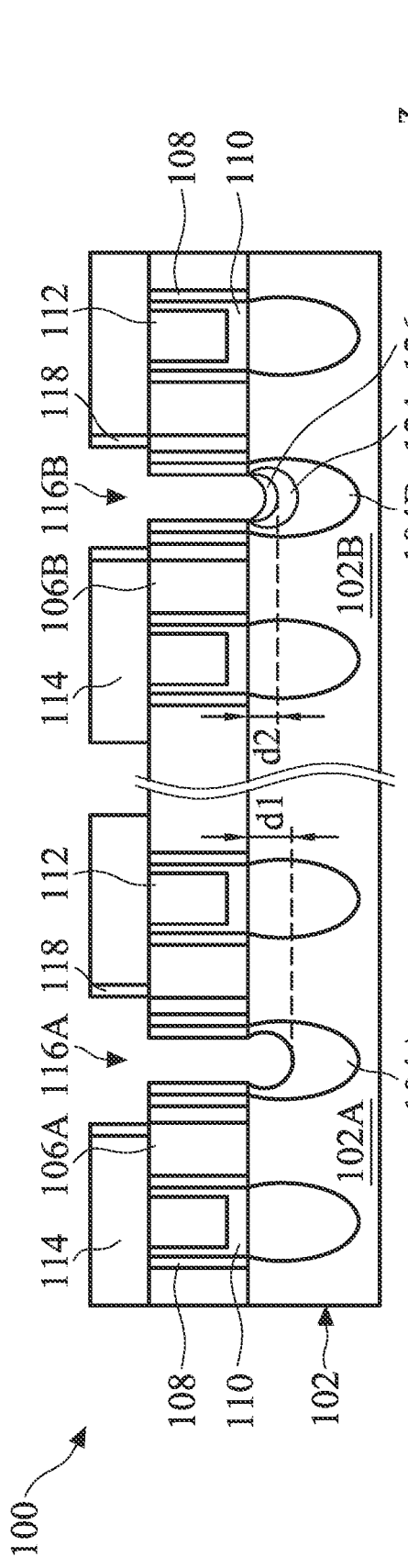
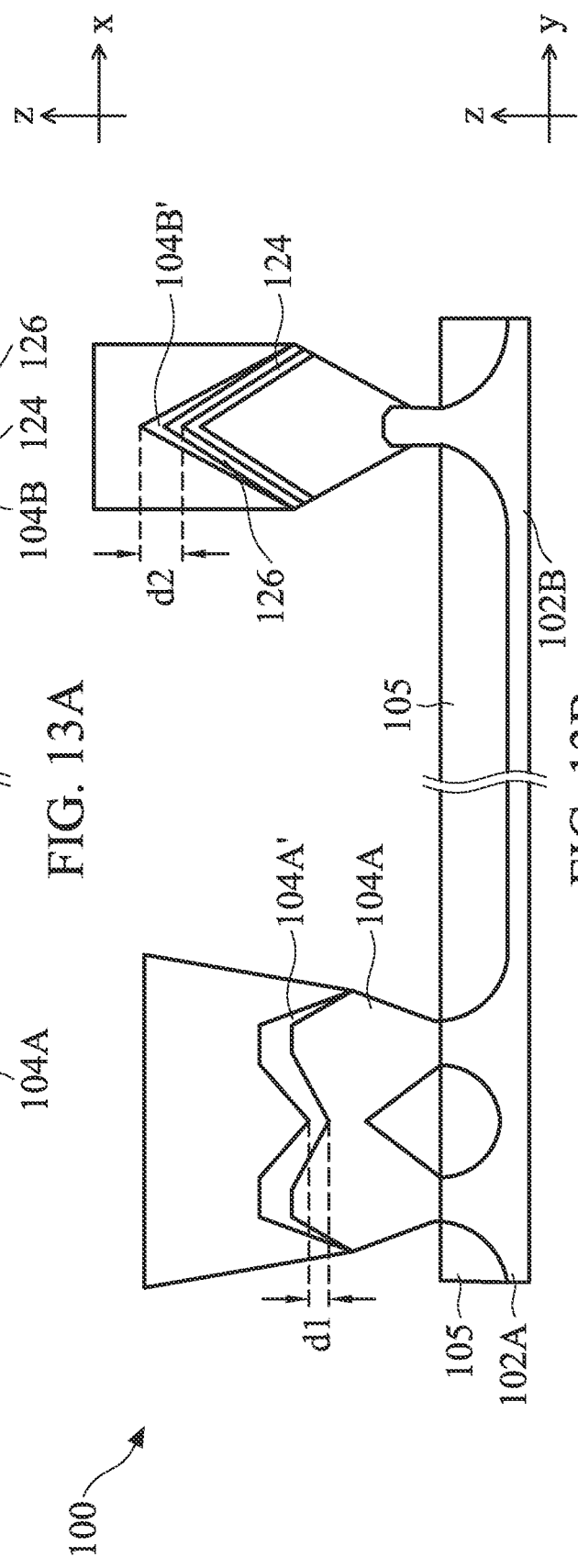
FIG. 13A
FIG. 13B

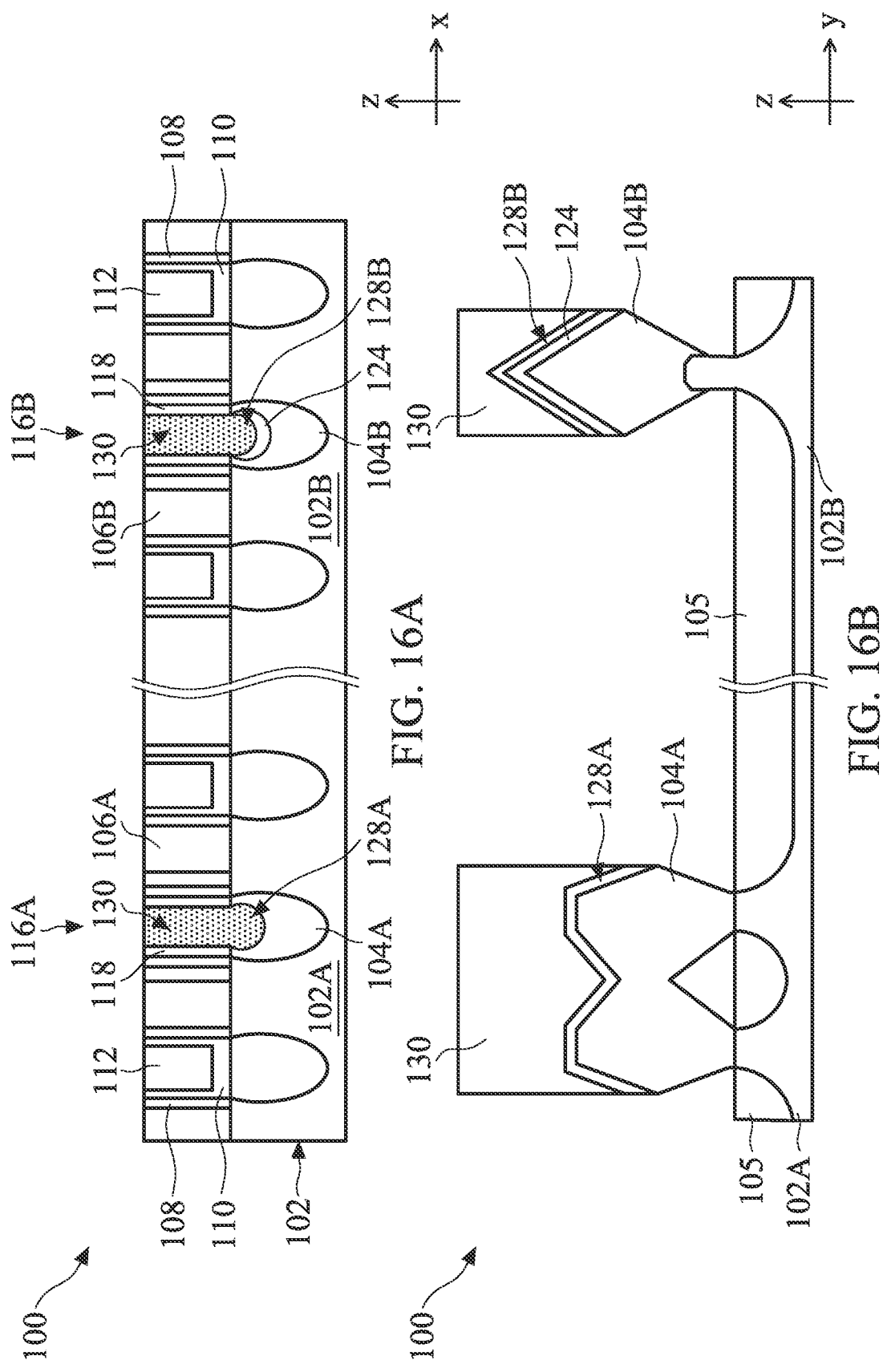

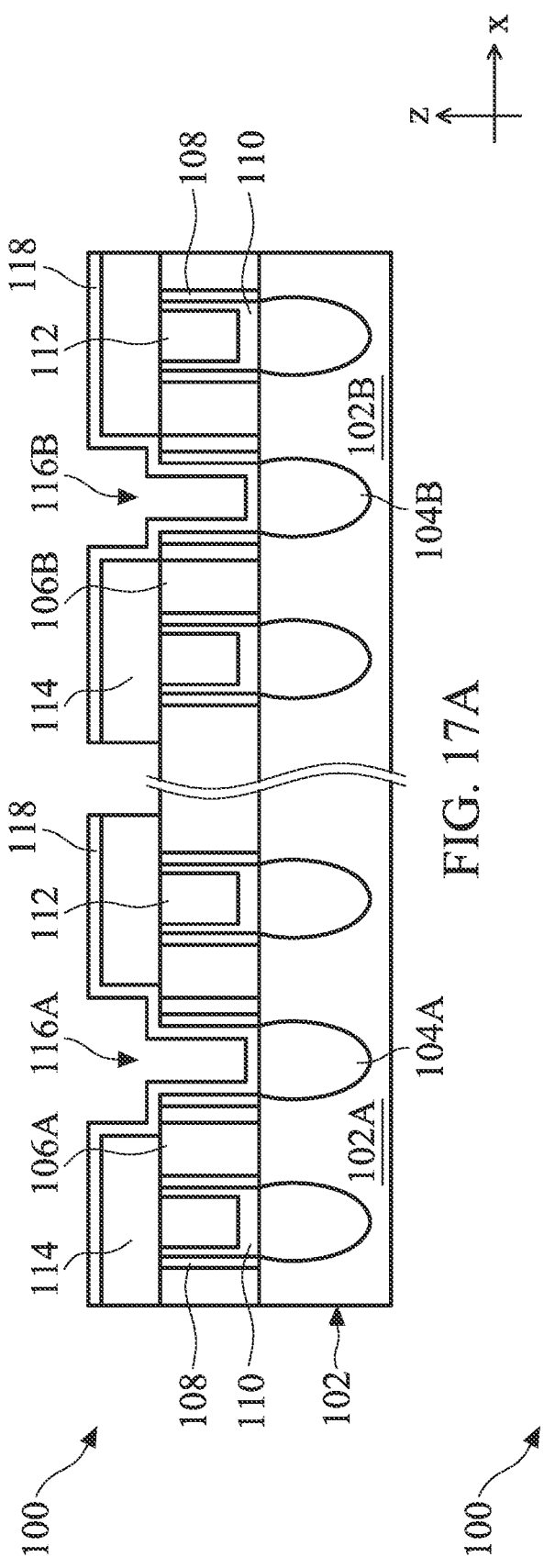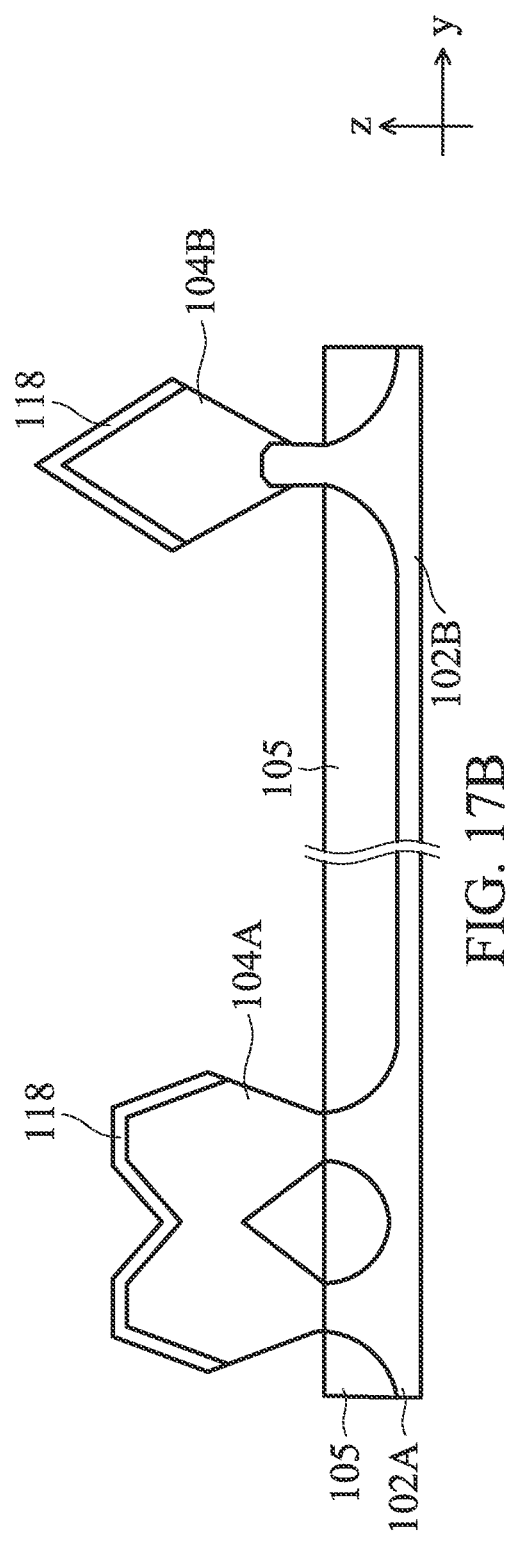

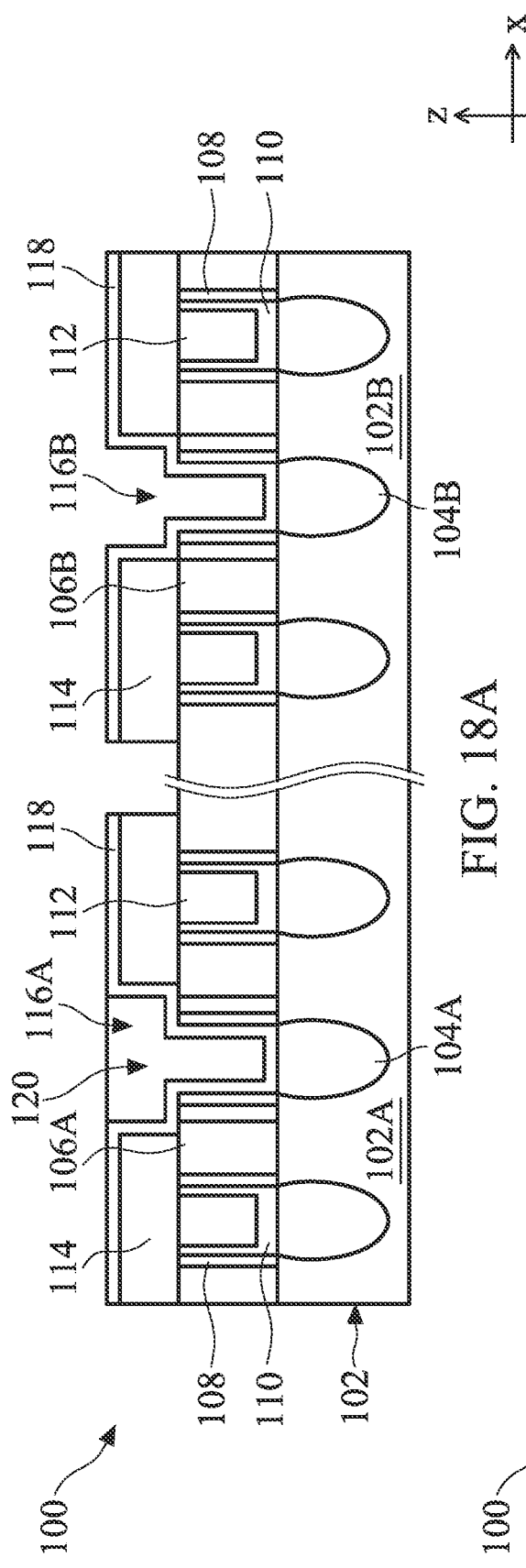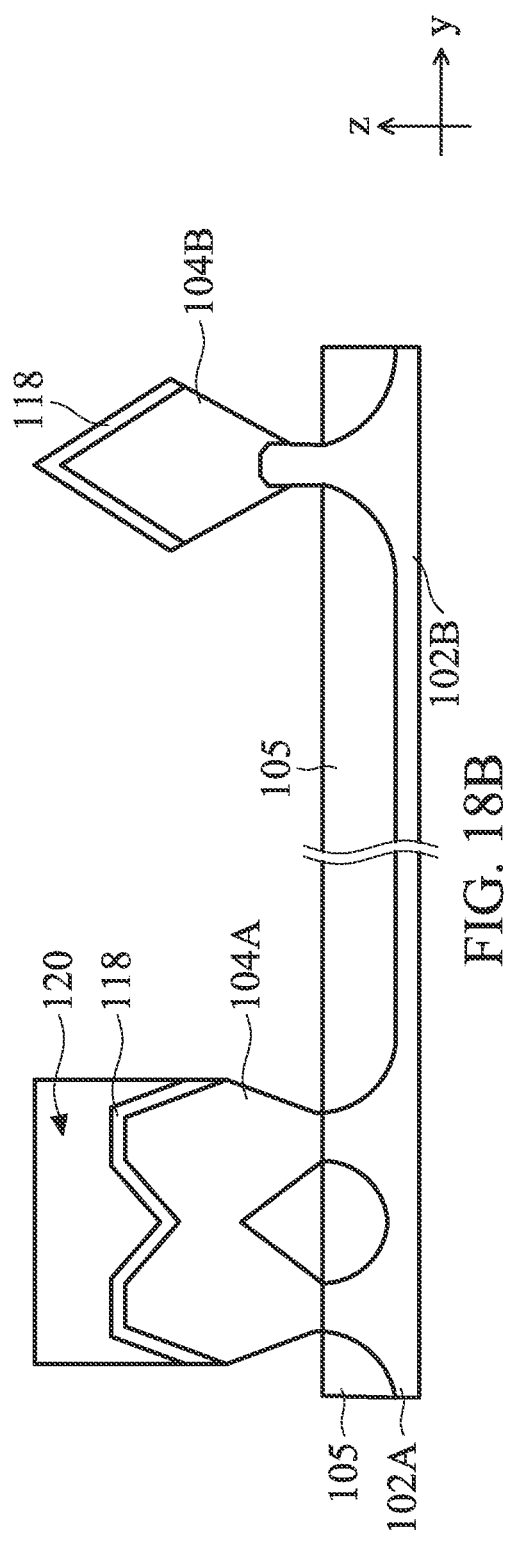
FIG. 18A
FIG. 18B

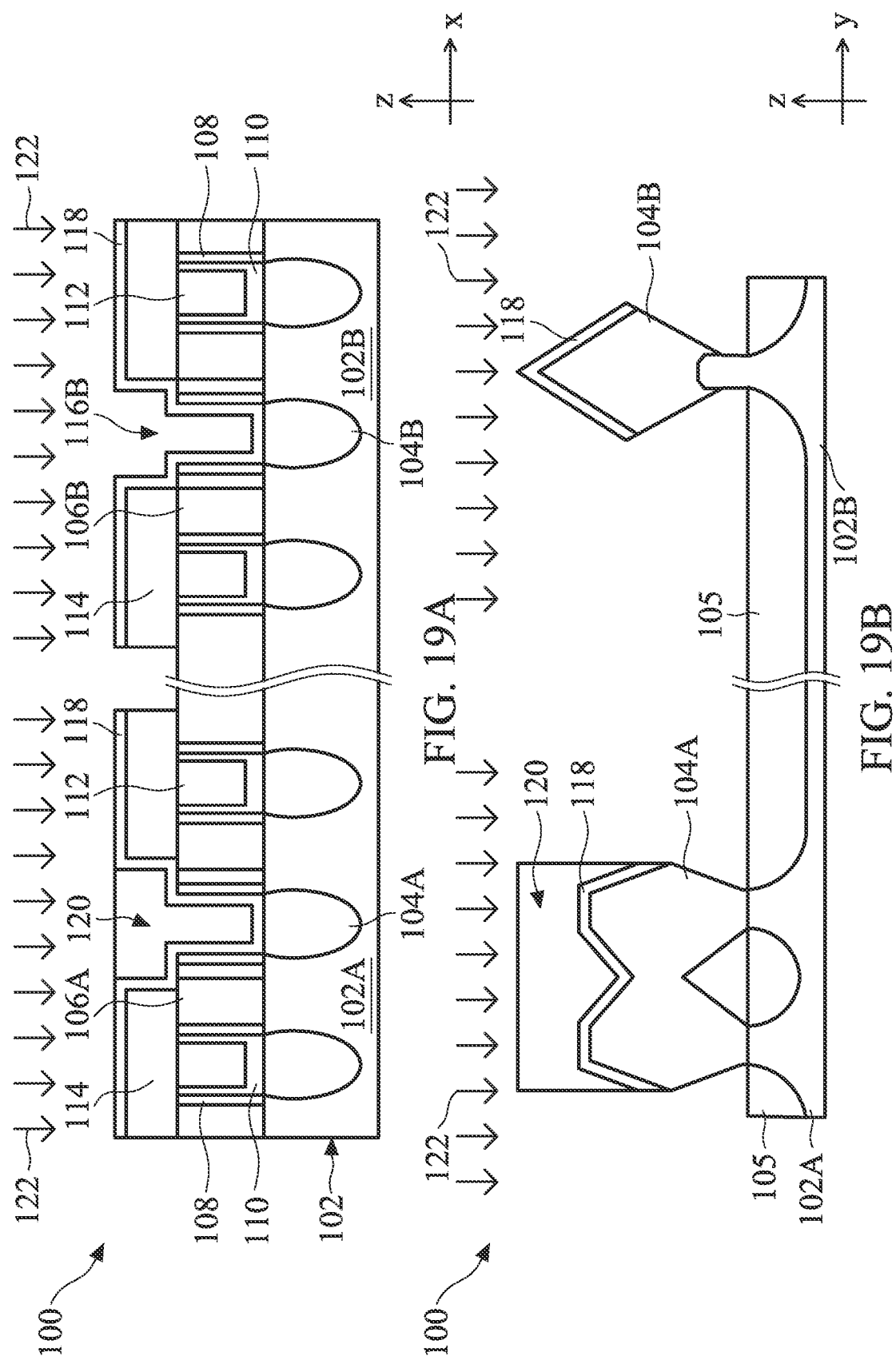

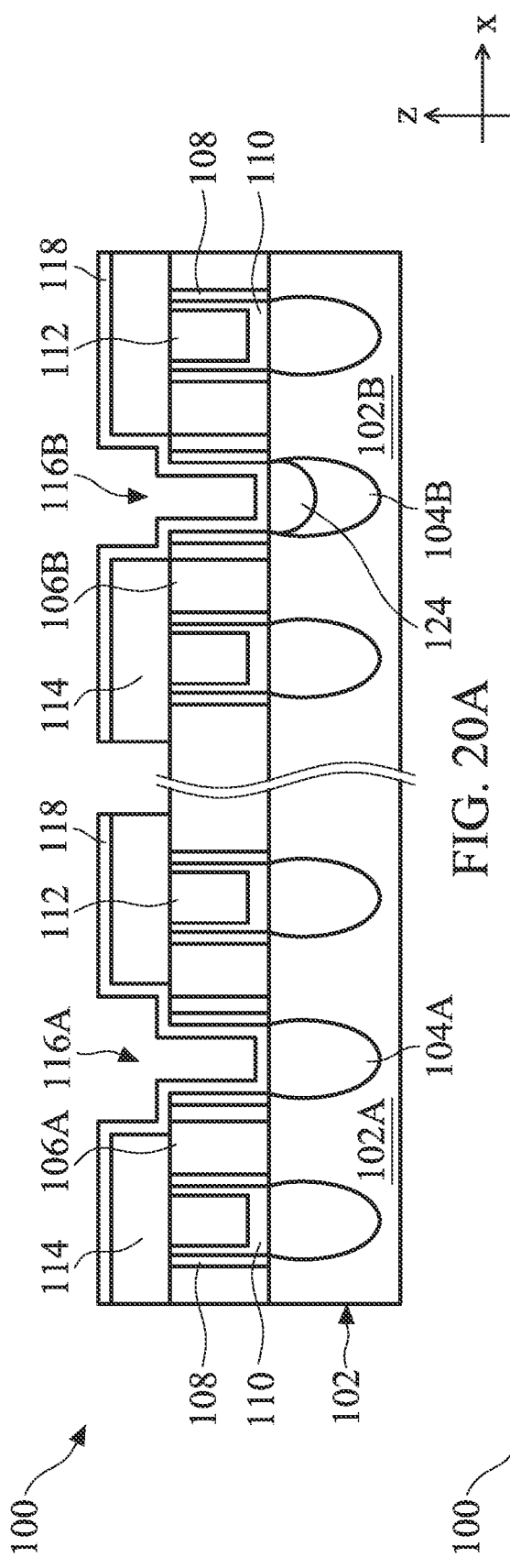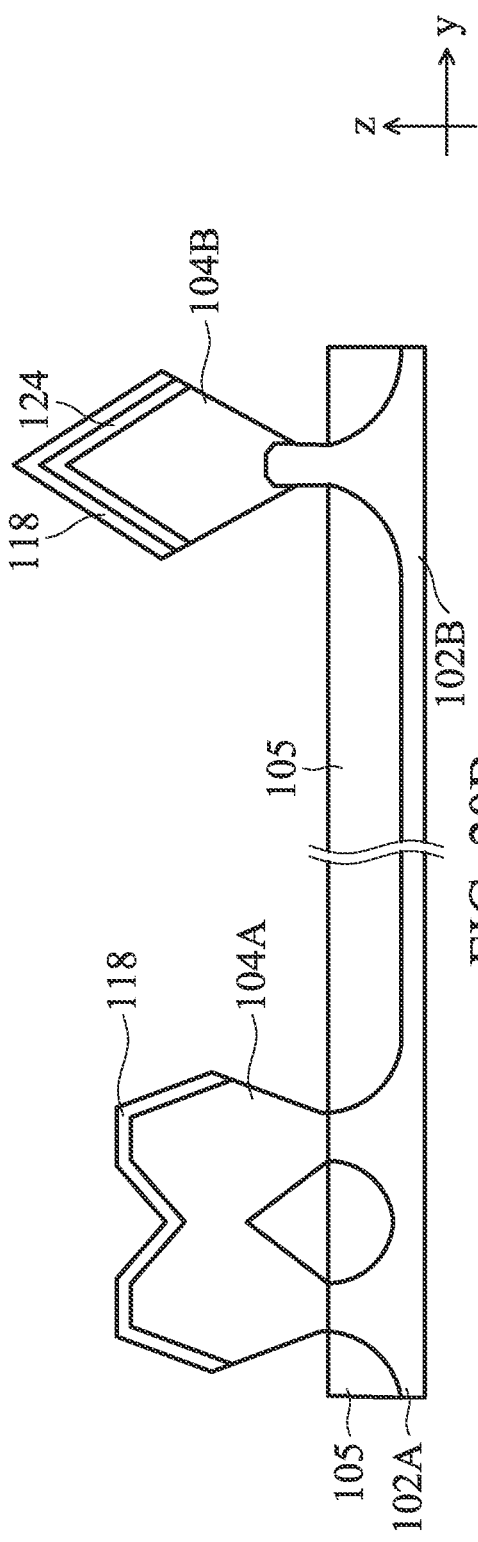
FIG. 20A
FIG. 20B

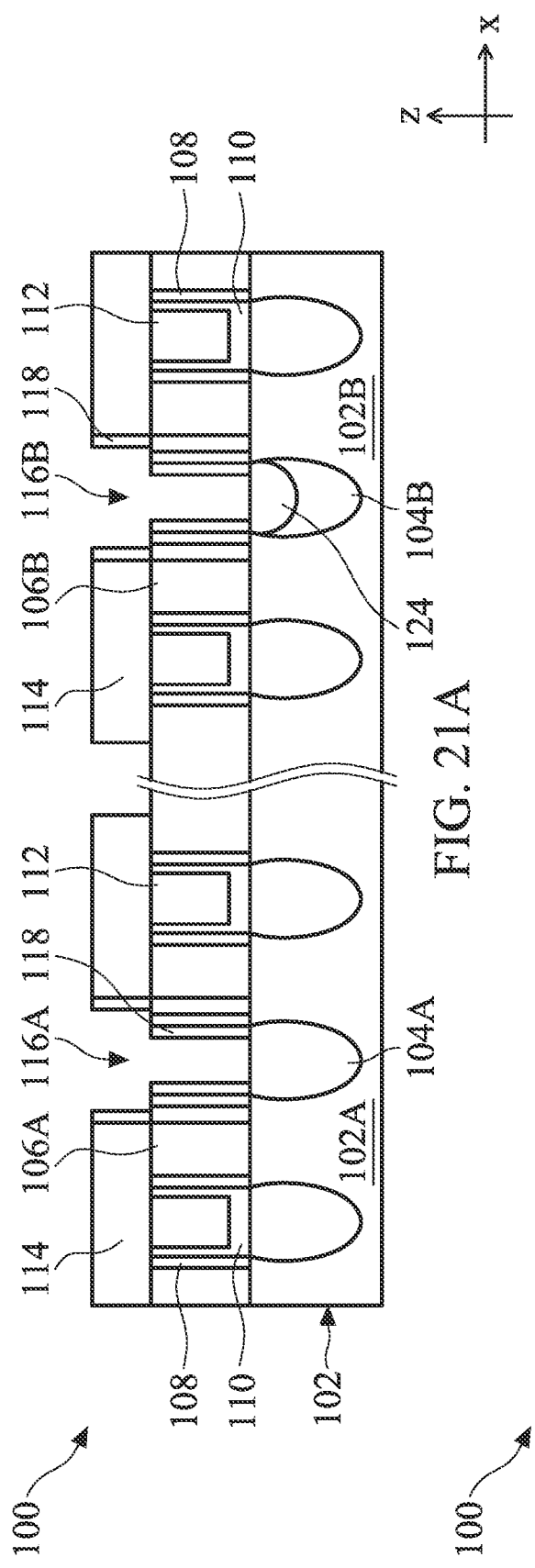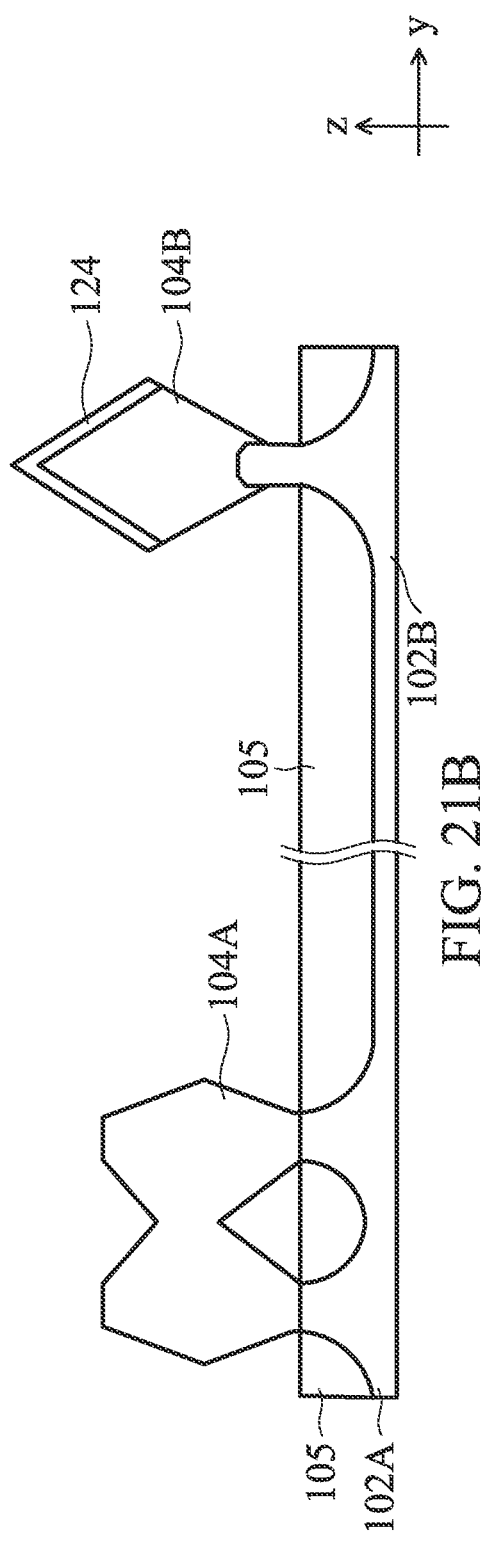
FIG. 21A
FIG. 21B

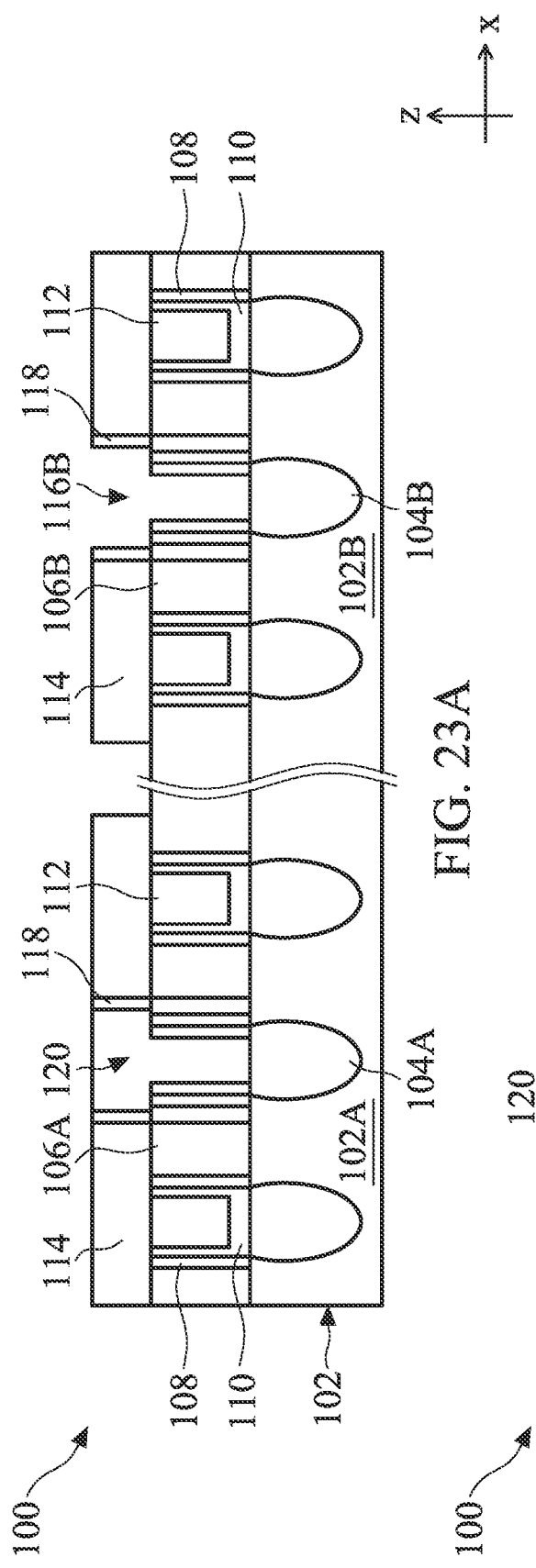
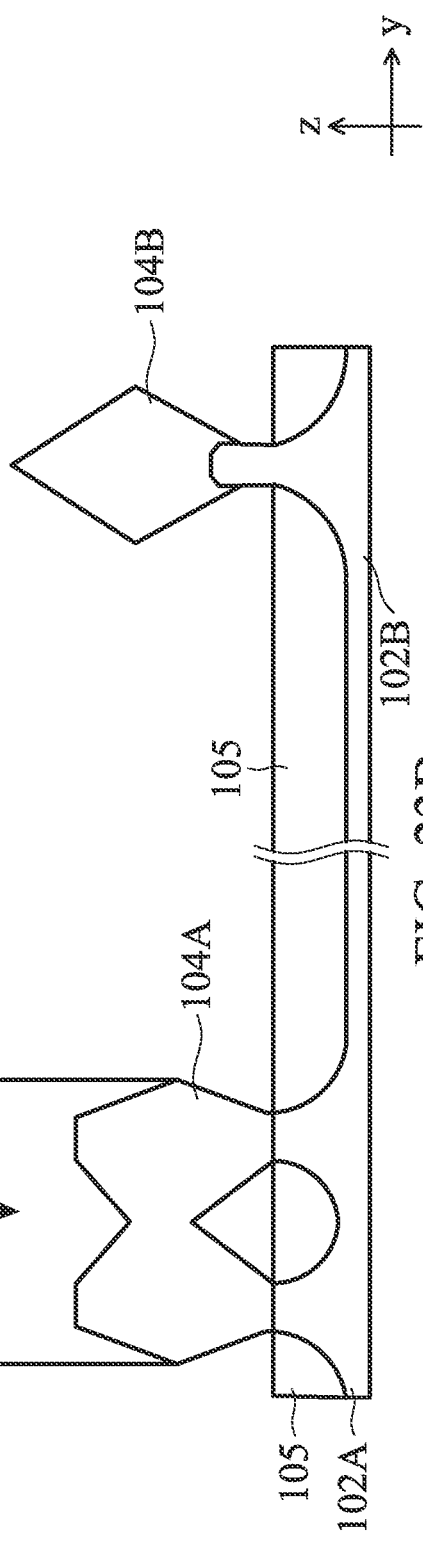
FIG. 23A
FIG. 23B

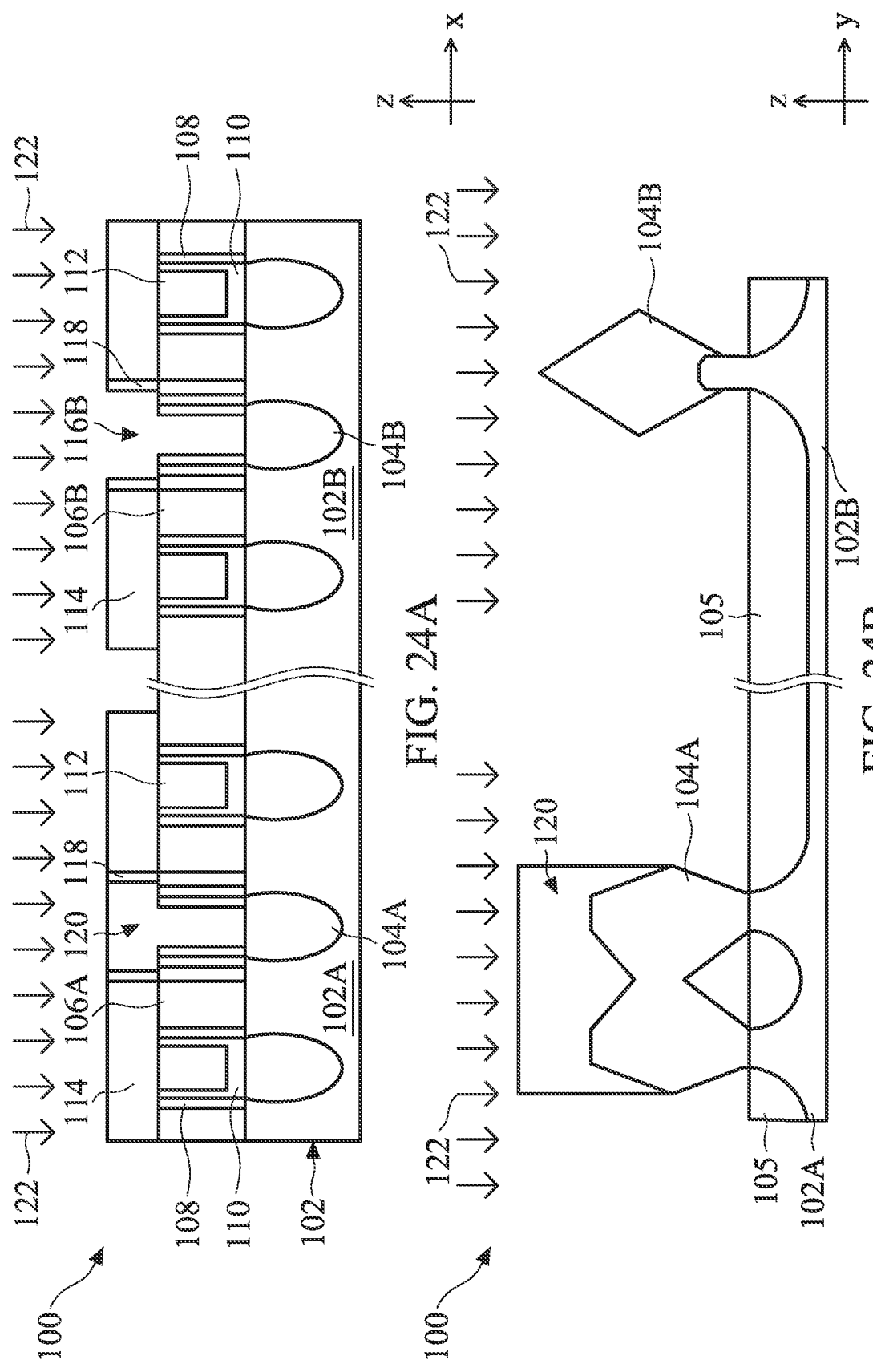

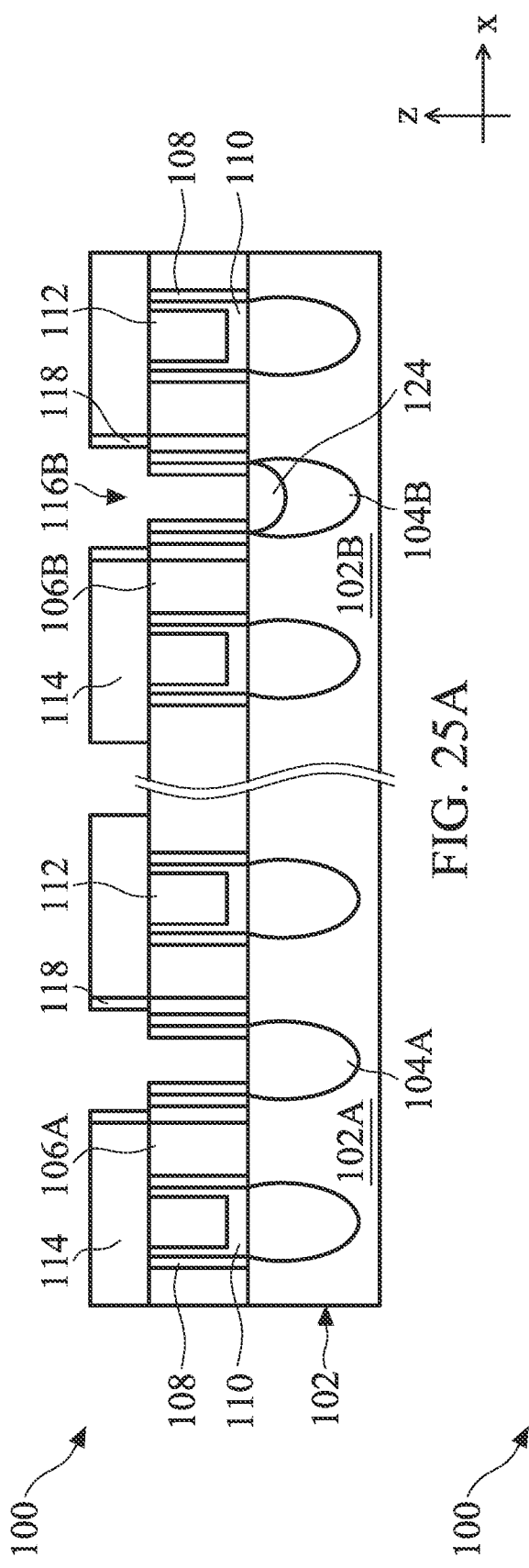
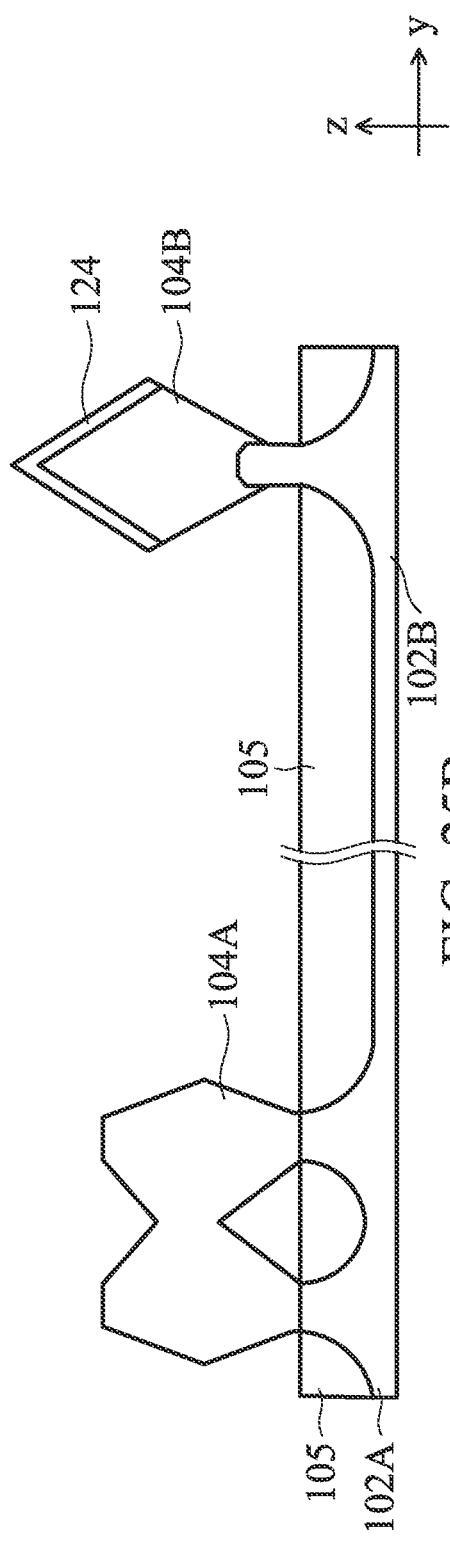
FIG. 25A
FIG. 25B

METHOD FOR FORMING SOURCE/DRAIN CONTACTS

PRIORITY DATA

This is a divisional application of U.S. patent application Ser. No. 15/867,058, filed Jan. 10, 2018, which claims the benefit of U.S. Provisional Application Ser. No. 62/589,080, entitled "Method for Forming Source/Drain Contacts," filed Nov. 21, 2017, the entire disclosures of which are herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when forming source/drain (S/D) contacts for small-scaled transistors, such as field effect transistors (FET) having fin-like channel (so-called "FinFETs"), it is sometimes desired to recess S/D features to lower contact resistance. However, sometimes the S/D feature recess process may remove too much pre-strained epitaxial materials, resulting in strain loss and undesirable device performance.

Therefore, improvements in the S/D contact formation are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A, 5A, 6A, 7A, 13A, 14A, 15A, and 16A are cross-sectional views (along a fin length direction) of a portion of a semiconductor device during various manufacturing stages according to the methods in FIGS. 1A, 1B, 2 and 3 in accordance with embodiments of the present disclosure.

FIGS. 4B, 5B, 6B, 7B, 13B, 14B, 15B, and 16B are cross-sectional views (along a fin width direction) of a portion of a semiconductor device during various manufacturing stages according to the method in FIGS. 1A, 1B, 2 and 3, in accordance with embodiments of the present disclosure.

FIGS. 8A, 9A, 10A, 11A, and 12A are cross-sectional views (along a fin length direction) of a portion of a semiconductor device during various manufacturing stages according to the method in FIGS. 1A and 1B in accordance with embodiments of the present disclosure.

FIGS. 8B, 9B, 10B, 11B, and 12B are cross-sectional views (along a fin width direction) of a portion of a semiconductor device during various manufacturing stages according to the method in FIGS. 1A and 1B in accordance with embodiments of the present disclosure.

FIGS. 17A, 18A, 19A, 20A, and 21A are cross-sectional views (along a fin length direction) of a portion of a semiconductor device during various manufacturing stages according to the method in FIGS. 2A and 2B in accordance with embodiments of the present disclosure.

FIGS. 17B, 18B, 19B, 20B, and 21B are cross-sectional views (along a fin width direction) of a portion of a semiconductor device during various manufacturing stages according to the method in FIGS. 2A and 2B in accordance with embodiments of the present disclosure.

FIGS. 22A, 23A, 24A, and 25A are cross-sectional views (along a fin length direction) of a portion of a semiconductor device during various manufacturing stages according to the method in FIGS. 3A and 3B in accordance with embodiments of the present disclosure.

FIGS. 22B, 23B, 24B, and 25B are cross-sectional views (along a fin width direction) of a portion of a semiconductor device during various manufacturing stages according to the method in FIGS. 3A and 3B in accordance with embodiments of the present disclosure.

DETAILED DESCRIPTION

Figure 1A:
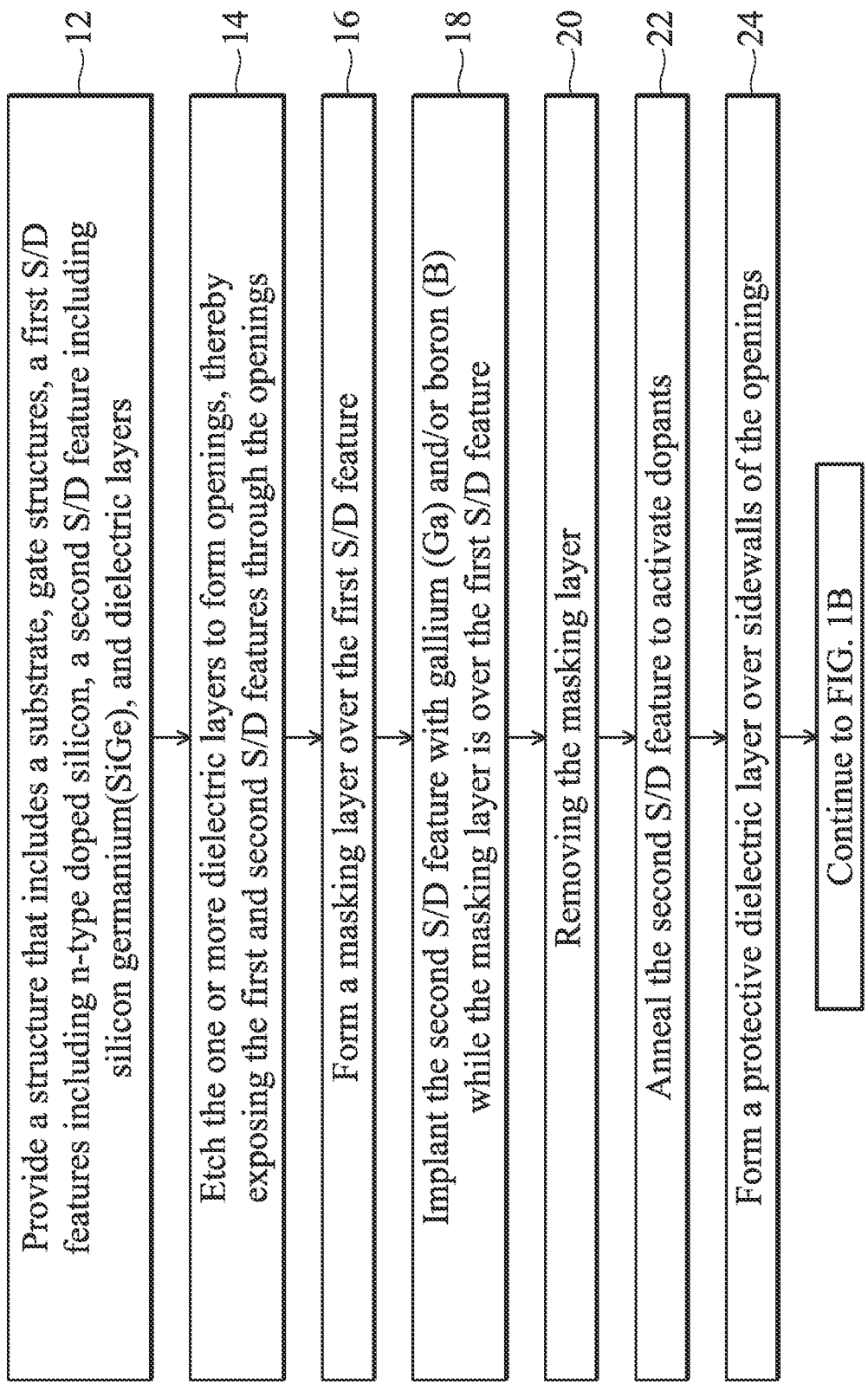
FIGS. 1A and 1B are a flow chart of a method of forming a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to forming S/D contacts in semiconductor devices, particularly for FinFETs. One object of the present disclosure is to reduce loss of strained epitaxial features during S/D contact formation. Another object of the present disclosure is to create different raised heights between a S/D feature of an n-type FET (NFET) and a S/D feature of a p-type FET (PFET) to lower contact resistance during S/D contact formation, while retaining built-in strain in the S/D features. More particularly, an embodiment of the present disclosure implants an S/D feature of a PFET with gallium and then oxidizes the implanted gallium with an oxygen-containing etchant to form gallium oxide. The presence of gallium oxide retards the etching rate of the S/D feature during S/D feature recess process, thereby preventing undesirable strain loss in the S/D feature of the PFET.

Figure 1B:
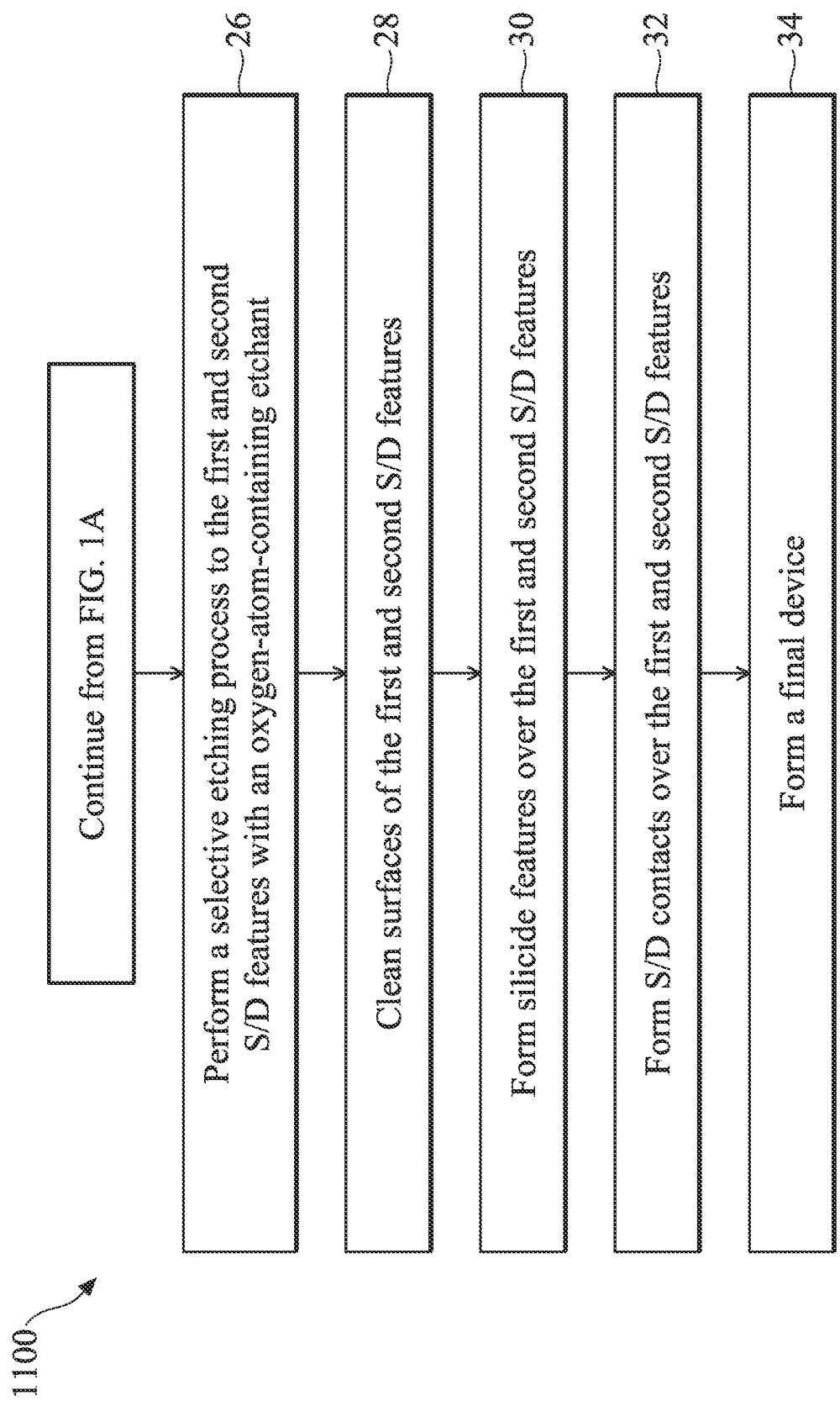

FIGS. 1A and 1B show a flow chart of a method 1100 of forming a semiconductor device 100. Method 1100 is described below in conjunction with FIGS. 4A-16B which are cross-sectional views of the semiconductor device 100 in various stages of a manufacturing process. Particularly, FIGS. 4A, 5A, 6A, 7A, 8A, 9A, 10A, 11A, 12A, 13A, 14A, 15A, and 16A are cross-sectional views of a portion of the device 100 along a fin length direction; and FIGS. 4B, 5B, 6B, 7B, 8B, 9B, 10B, 11B, 12B, 13B, 14B, 15B, and 16B are cross-sectional views of the portion of the device 100 along a fin width direction.

Figure 2A:
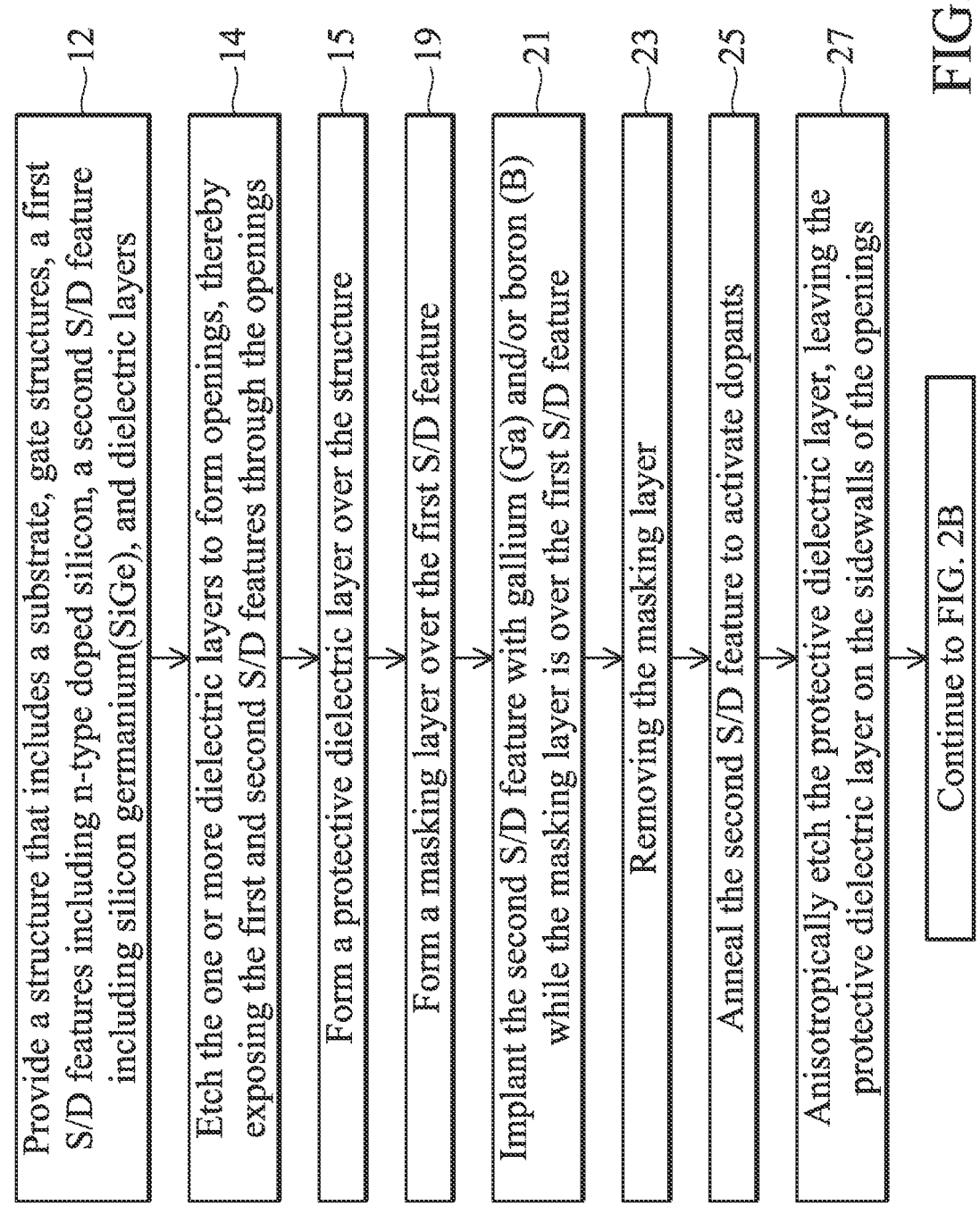
FIGS. 2A and 2B are a flow chart of another method of forming a semiconductor device according to embodiments of the present disclosure.
Figure 2B:
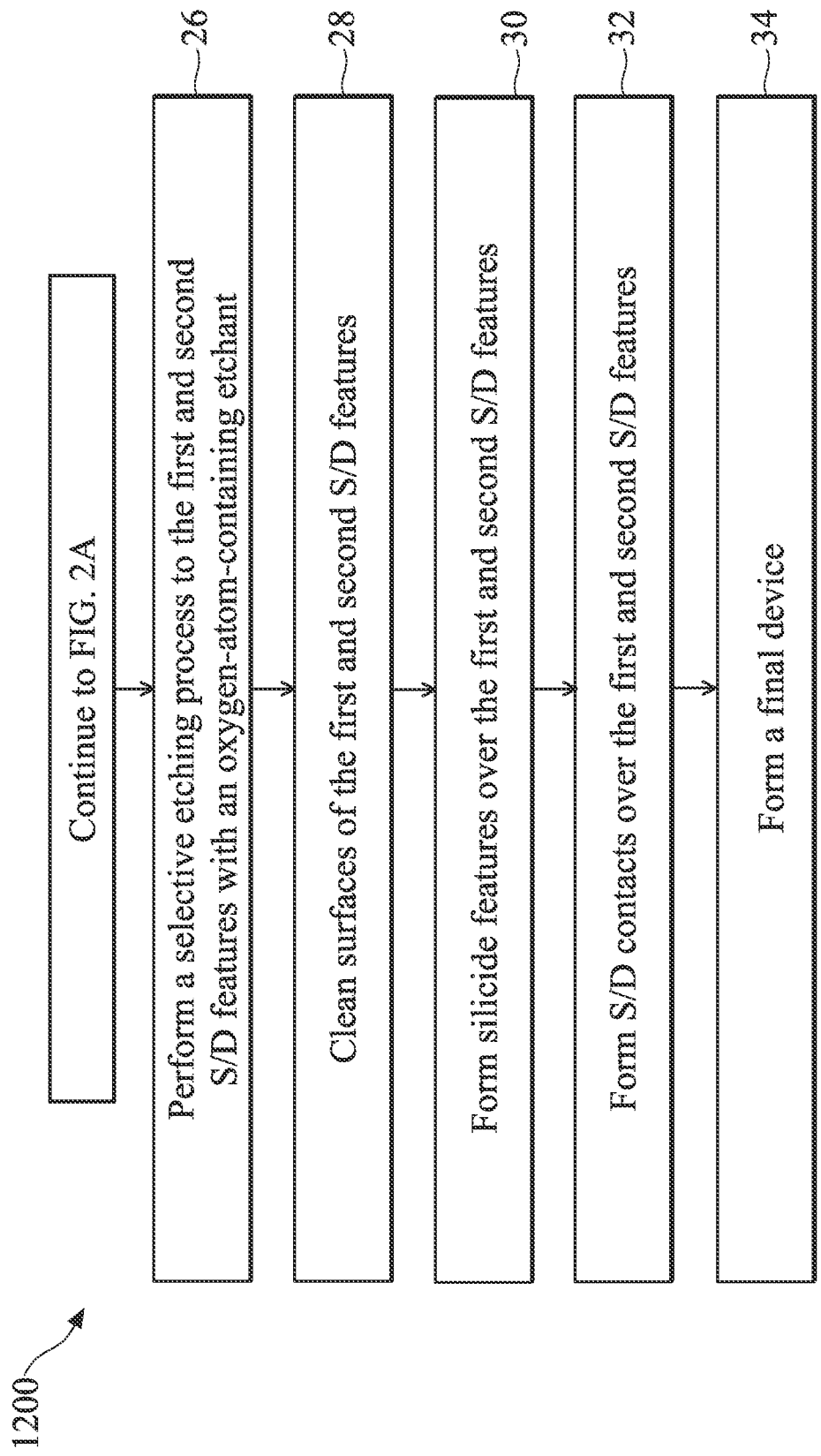

FIGS. 2A and 2B show a flow chart of a method 1200 of forming a semiconductor device 100. Method 1200 is described below in conjunction with FIGS. 4A-7B, 17A-21B, and 13A-16B, which are cross-sectional views of the semiconductor device 100 in various stages of a manufacturing process. Particularly, FIGS. 4A, 5A, 6A, 7A, 17A, 18A, 19A, 20A, 21A, 13A, 14A, 15A, and 16A are cross-sectional views of a portion of the device 100 along a fin length direction; and FIGS. 4B, 5B, 6B, 7B, 17B, 18B, 19B, 20B, 21B, 13B, 14B, 15B, and 16B are cross-sectional views of the portion of the device 100 along a fin width direction.

Figure 3A:
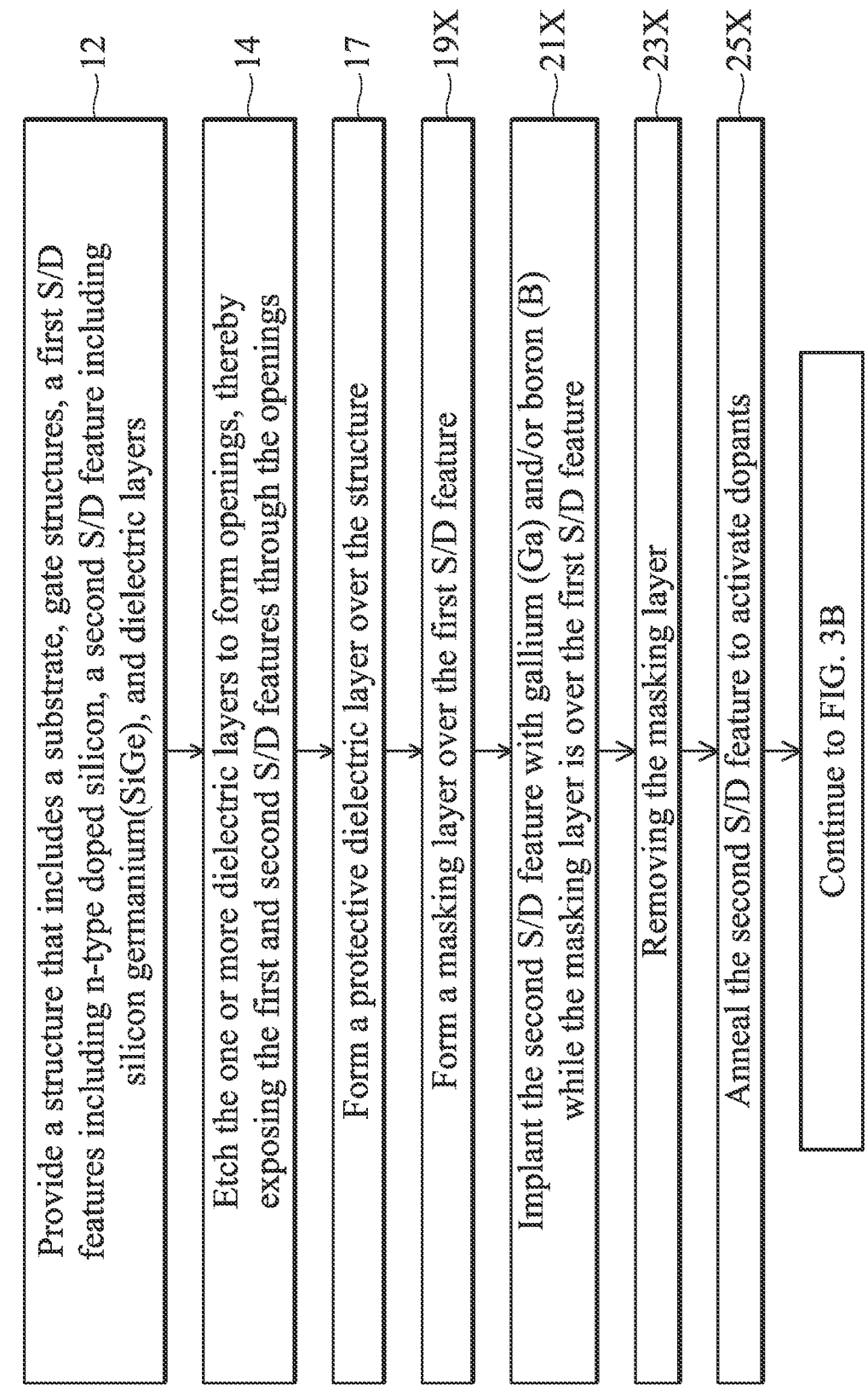
FIGS. 3A and 3B are a flow chart of yet another method of forming a semiconductor device according to embodiments of the present disclosure.
Figure 3B:
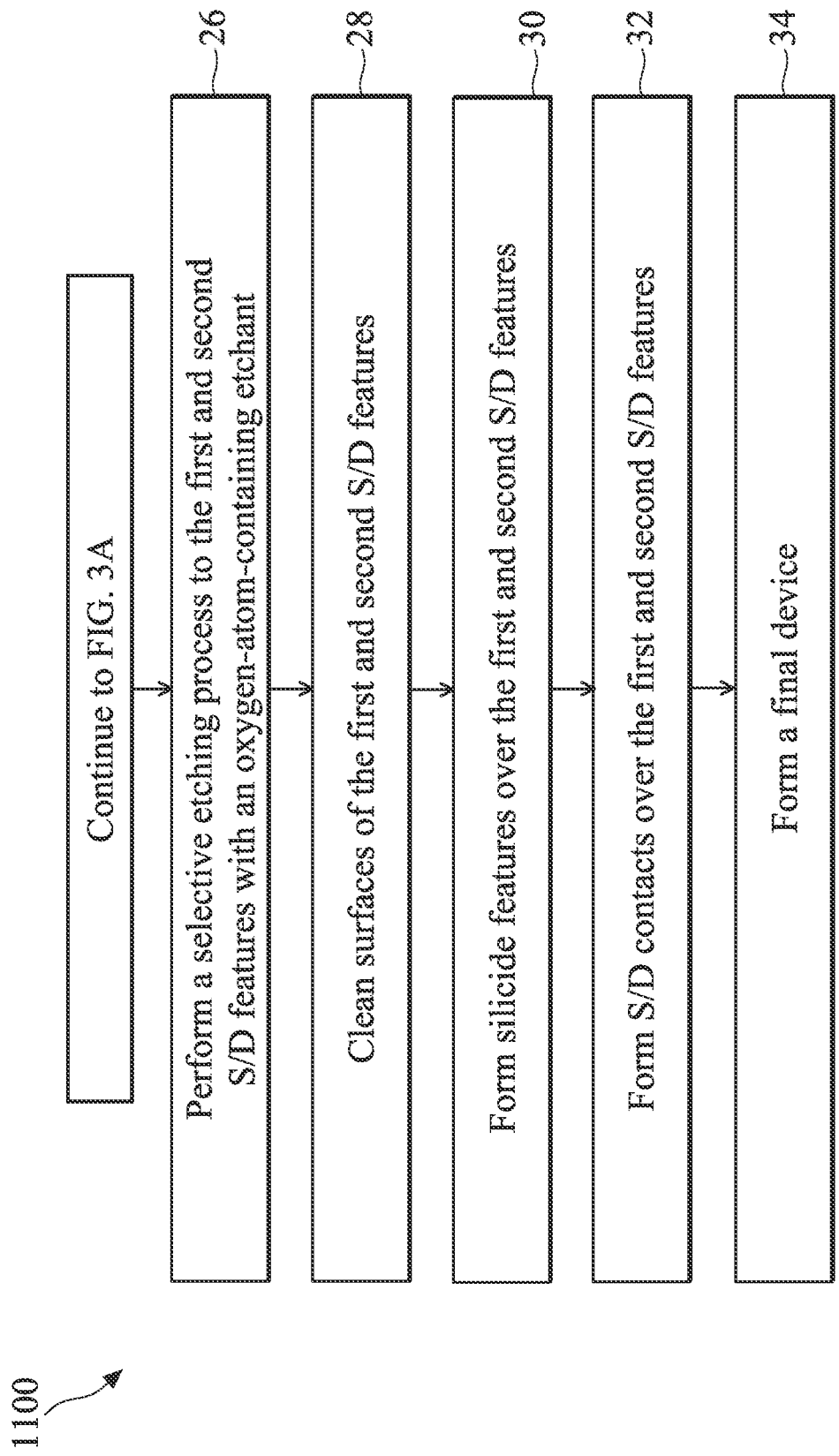

FIGS. 3A and 3B show a flow chart of a method 1300 of forming a semiconductor device 100. Method 1300 is described below in conjunction with FIGS. 4A-7B, 22A-25B, and 13A-16B, which are cross-sectional views of the semiconductor device 100 in various stages of a manufacturing process. Particularly, FIGS. 4A, 5A, 6A, 7A, 22A, 23A, 24A, 25A, 13A, 14A, 15A, and 16A are cross-sectional views of a portion of the device 100 along a fin length direction; and FIGS. 4B, 5B, 6B, 7B, 22B, 23B, 24B, 25B, 13B, 14B, 15B, and 16B are cross-sectional views of the portion of the device 100 along a fin width direction.

The methods 1100, 1200 and 1300 are merely examples, and are not intended to limit the present disclosure beyond what is explicitly recited in the claims. Additional operations can be provided before, during, and after the methods 101, 102 and 103, and some operations described can be replaced, eliminated, or moved around for additional embodiments of the methods.

Reference is now made to FIGS. 1A and 1B, where the flow chart of method 1100 is demonstrated. The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 4A-25B may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 1A, at operation 12, method 1100 provides a structure of the device 100 as shown in FIGS. 4A and 4B. Referring now to FIGS. 4A and 4B, the device 100 includes a substrate 102 and various features formed therein or thereon. The substrate 102 includes two substrate regions 102A and 102B. In the present embodiment, the substrate region 102A is for forming one or more n-type FinFET devices, and the substrate region 102B is for forming one or more p-type FinFET devices. Therefore, the substrate region 102A is also referred to as the NFET region 102A, and the substrate region 102B is also referred to as the PFET region 102B. The NFET region 102A and PFET region 102B each include one or more semiconductor fins 103 separated by an isolation structure 105 (FIG. 4B). Particularly, FIG. 4A illustrates the device 100 in a cross-sectional view along the length of the fins 103 (the "x" direction), and FIG. 4B illustrates the device 100 in a cross-sectional view along the width of the fins 103 (the "y" direction) in S/D regions of the device 100. In the NFET region 102A, the device 100 further includes S/D features 104A over the fins 103, and gate stacks 106A adjacent to channel regions of the fins 103 and sandwiched by adjacent S/D features 104A. In the PFET region 102B, the device 100 further includes S/D features 104B over the fins 103, and gate stacks 106B adjacent to channel regions of the fins 103 and sandwiched by adjacent S/D features 104B. The device 100 further includes a gate spacer 108 on sidewalls of the gate stacks 106A and 106B, a contact etch stop layer (CESL) 110 over the gate spacer 108 and the S/D features 104A and 104B, and a dielectric layer 112 over the CESL 110 and filling in the gaps between adjacent gate spacers 108. The various features (or components) of the device 100 are further described below. Gate stacks, such as gate stacks 106A and 106B, can sometimes be referred to as gate structures.

The substrate 102 is a silicon (Si) substrate in the present embodiment. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable.

The S/D features 104A and 104B may include epitaxial semiconductor materials, for example, for applying proper stress and enhancing performance of the device 100. For example, the S/D features 104A may include epitaxially grown silicon (Si) or silicon carbide (SiC), and the S/D features 104B may include epitaxially grown silicon germanium (SiGe). Further, the S/D features 104A and 104B may be doped with proper dopants suitable for the respective n-type and p-type devices. For example, the S/D features 104A may be doped with an n-type dopant such as phosphorus (P) or arsenic (As), and the S/D features 104B may be doped with a p-type dopant such as boron (B) or indium (In). In one implementation, the S/D feature 104A is formed of epitaxially grown silicon doped with phosphorous and the S/D feature 104B is formed of epitaxially grown silicon germanium doped with boron. In an embodiment, the S/D features 104A and 104B are formed (separately) by etching the fins 103, epitaxially growing a proper semiconductor material over the fins 103, and doping (in-situ or ex-situ) appropriate dopants into the epitaxially grown material. Adjacent S/D features 104A may be separated from each other (not shown) or may merge (e.g., the two 104A in FIG. 4B) in some embodiments. Similarly, adjacent S/D features 104B may be separated from each other (e.g., FIG. 4B) or may merge (not shown) in some embodiments. Furthermore, each of the S/D features 104A and 104B may be of a multi-facet shape.

The isolation structure 105 may include silicon oxide ($SiO_2$), silicon nitride (SiN), silicon oxynitride (SiON), fluoride-doped silicate glass (FSG), a low-k dielectric material, and/or other suitable insulating material. In an embodiment, the isolation structure 105 is formed by etching trenches in the substrate 102 (e.g., as part of the process of forming the fins 103), filling the trenches with an insulating material, and performing a chemical mechanical planarization (CMP) process to the substrate 102 including the insulating material. Other types of isolation structure may also be suitable, such as field oxide and LOCal Oxidation of Silicon (LOCOS).

Each of the gate stacks 106A and 106B is a multi-layer structure. For example, each of the gate stacks 106A and 106B may include a dielectric interfacial layer, a gate dielectric layer over the dielectric interfacial layer, and a gate electrode layer over the gate dielectric layer. In an embodiment, the gate stacks 106A and 106B are placeholders (so-called "dummy gates" or "temporary gates") for high-k metal gates, wherein one or more of the layers in the gate stacks 106A and 106B are replaced in a later process. In another embodiment, the gate stacks 106A and 106B include a high-k gate dielectric layer, a work function layer over the high-k gate dielectric layer, and a metal layer over the work function layer. In various embodiments, the dielectric interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The gate dielectric layer may include silicon oxide ($SiO_2$). The high-k gate dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The gate electrode layer may include polysilicon or a metal such as aluminum (Al), tungsten (W), cobalt (Co), copper (Cu), and/or other suitable materials. The work function layer may be p-type (for gate stacks 106B) or n-type (for gate stacks 106A). The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The p-type or n-type work function layer may include a plurality of layers and may be deposited by CVD, PVD, and/or other suitable process.

The gate spacer 108 may be a single layer or multi-layer structure. In some embodiments, the gate spacer 108 includes a dielectric material, such as silicon oxide ($SiO_2$), silicon nitride (SiN), silicon oxynitride (SiON), other dielectric material, or combination thereof. In an example, the gate spacer 108 is formed by blanket depositing a first dielectric layer (e.g., a $SiO_2$ layer having a uniform thickness) as a liner layer over the device 100 having the gate stacks 106A and 106B, and a second dielectric layer (e.g., a SiN layer) as a main D-shaped spacer over the first dielectric layer, and then, anisotropically etching to remove portions of the dielectric layers to form the gate spacer 108.

The CESL 110 may include silicon nitride (SiN or $Si_3N_4$), silicon oxynitride (SiON), silicon nitride with oxygen (O) or carbon (C) elements, and/or other materials. In one example, the CESL 110 includes silicon nitride ($Si_3N_4$) having an intrinsic stress with a magnitude of 1 GPa or higher. The intrinsic stress is compressive for p-channel devices and tensile for n-channel devices. The CESL 110 may be formed by PECVD process and/or other suitable deposition or oxidation processes. The CESL 110 covers the outer surfaces of the S/D features 104A and 104B, the sidewalls of the gate spacer 108, and the top surface of the isolation structure 105.

The dielectric layer (or interlayer dielectric) 112 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 112 may be deposited by a PECVD process, a flowable CVD (FCVD) process, or other suitable deposition technique. In an embodiment, the CESL 110 is deposited as a blanket layer over the substrate 102 covering various structures thereon, and the dielectric layer 112 is deposited over the CESL 110 to fill trenches between the gate stacks 106A and 106B.

Figure 5A:
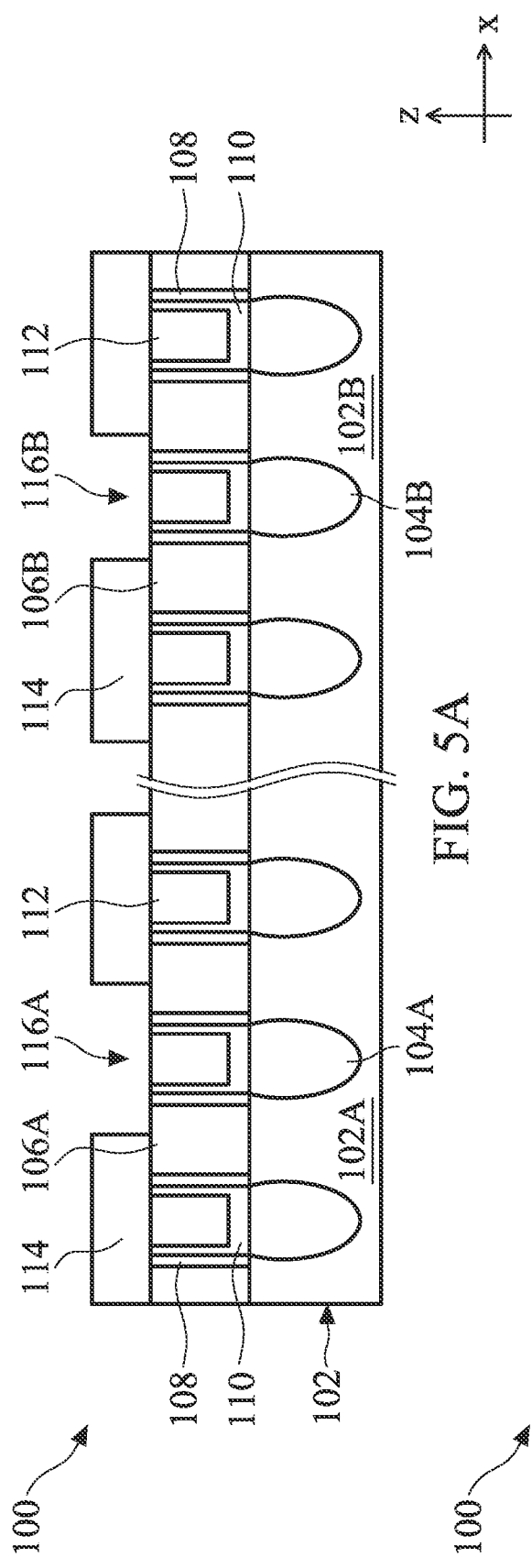
Figure 5B:
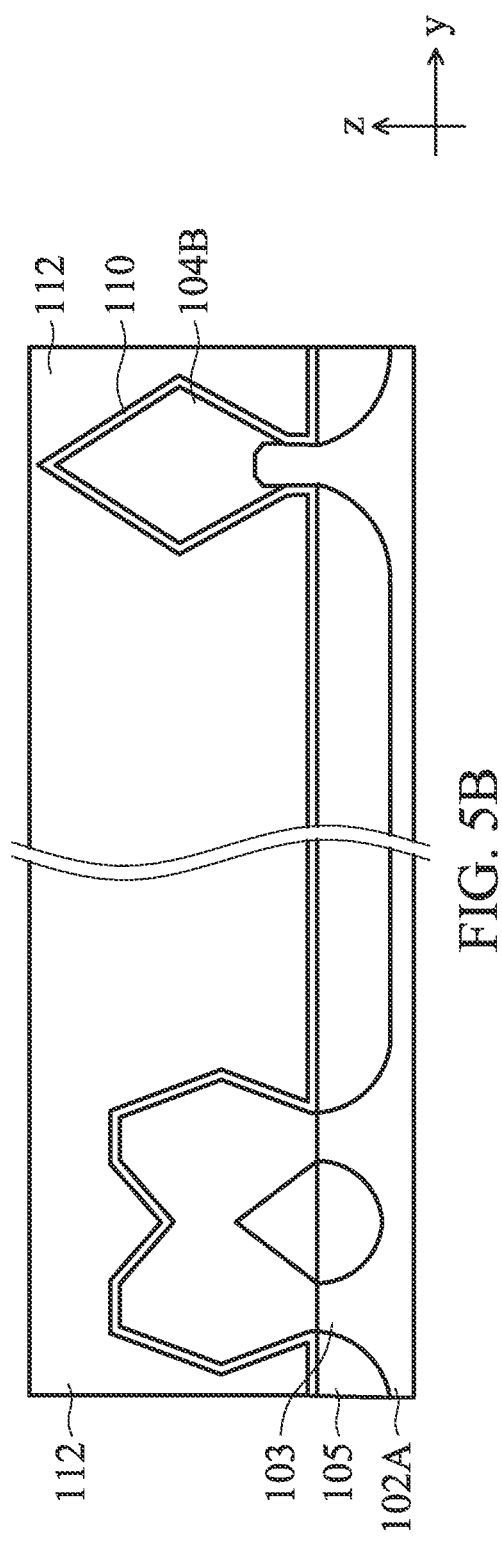
Figure 6A:
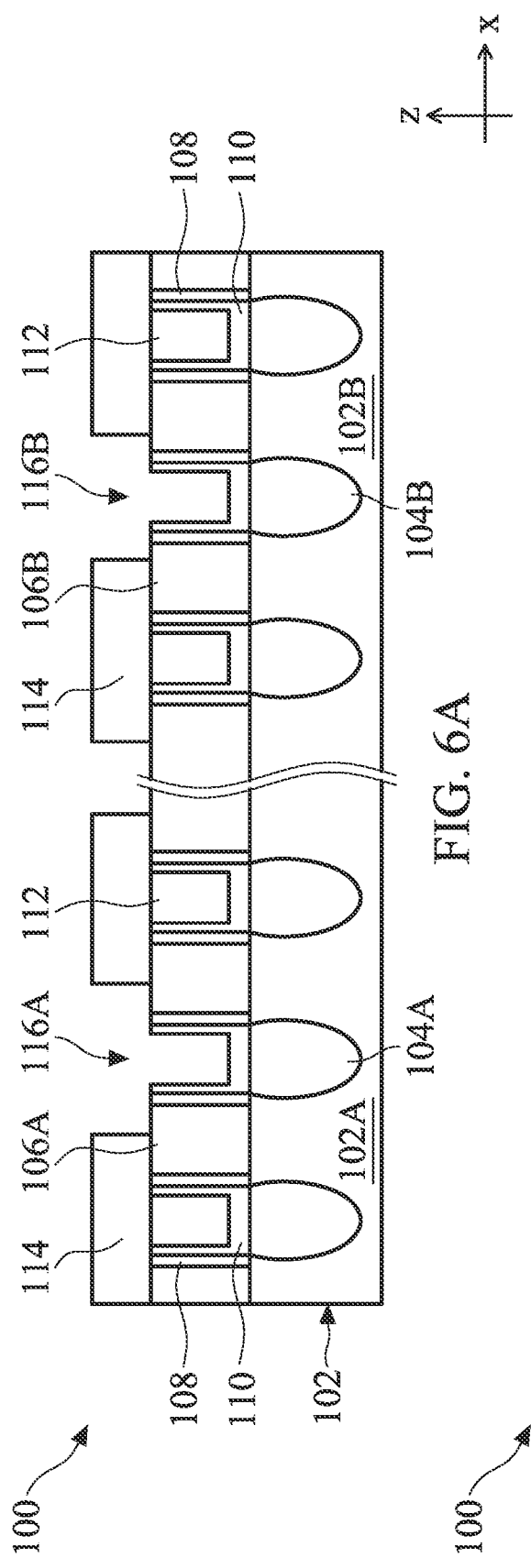
Figure 6B:
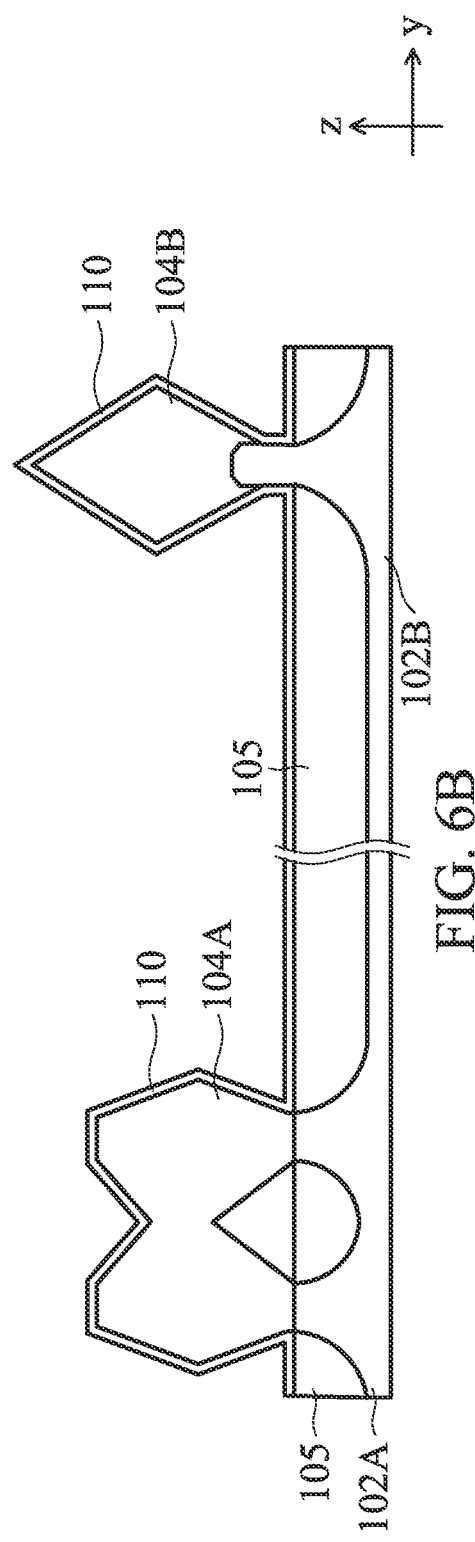
Figure 7A:
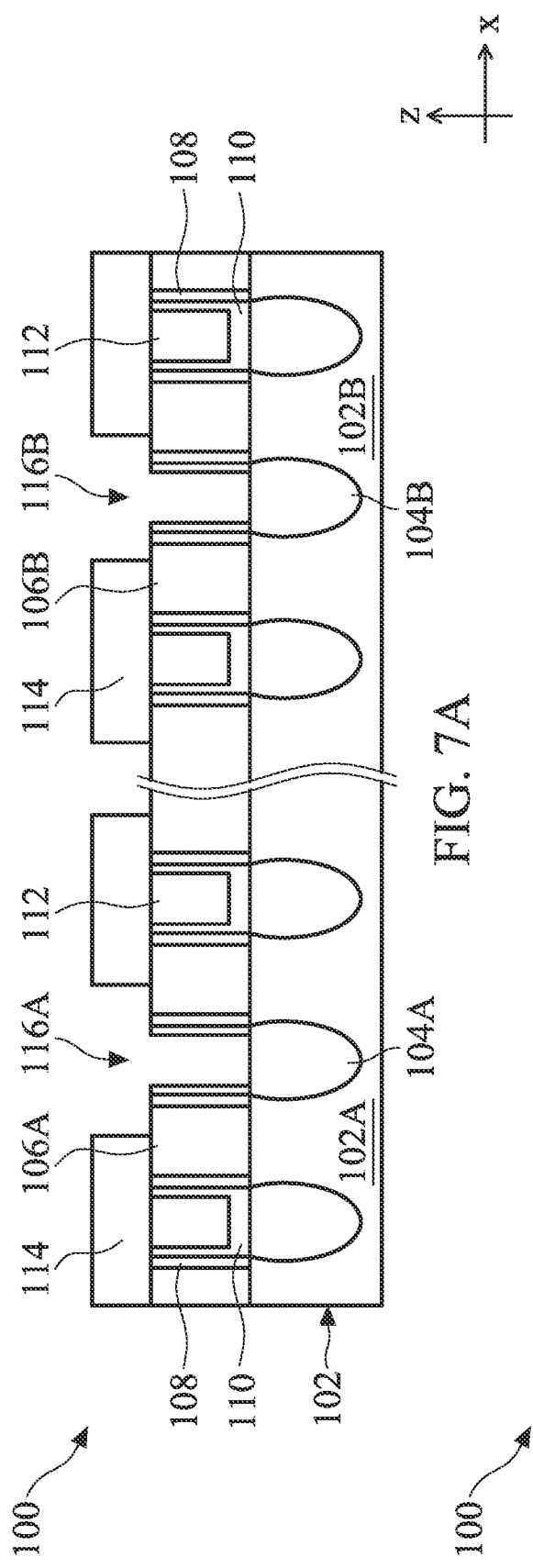
Figure 7B:
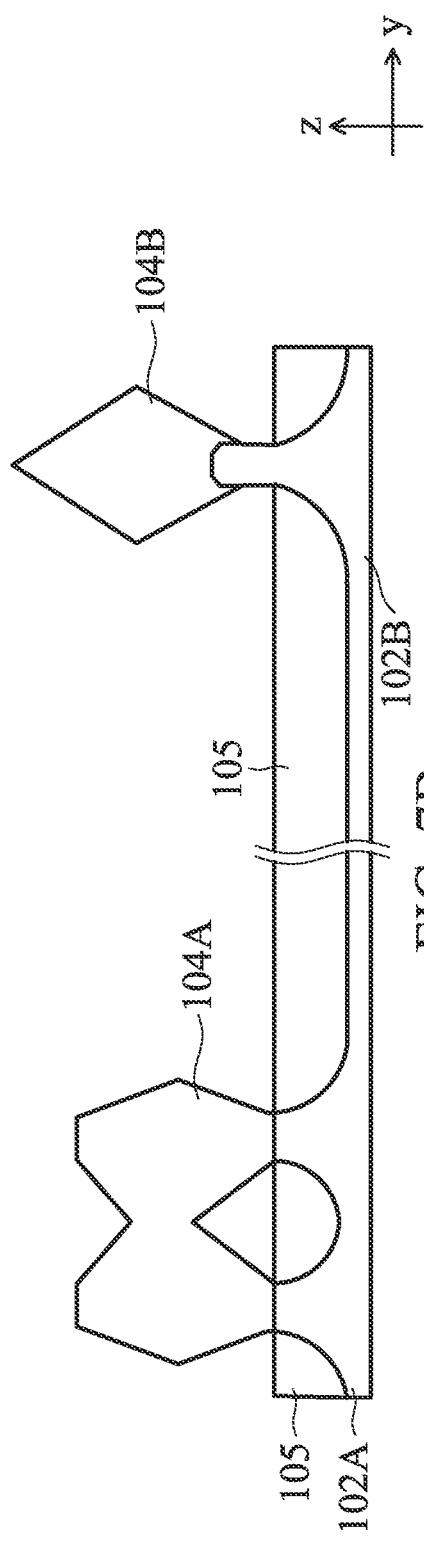

At operation 14, method 1100 (FIG. 1A) etches the dielectric layer 112 and the CESL 110 to expose the S/D features 104A and 104B, in preparation for forming S/D contacts over the respective S/D features. This may involve a variety of processes including deposition, photolithography, and etching. Referring to FIGS. 5A and 5B, an etch mask 114 is formed over the device 100, providing openings 116A and 116B exposing various portions of the device 100. The openings 116A and 116B correspond to the areas of the device 100 where S/D contacts for S/D features 104A and 104B are to be formed. In various embodiments, the etch mask 114 may include a hard mask layer (e.g., having silicon nitride or silicon oxide), a photoresist layer, or a combination thereof. Referring to FIGS. 6A and 6B, the device 100 is etched through the openings 116A and 116B to remove the exposed portions of the dielectric layer 112, for example, using a dry etching process, a wet etching process, or a reactive ion etching process. In the present embodiment, the etching process is selective to the material of the dielectric layer 112, and does not (or insignificantly) etch the gate stacks 106A and 106B, the gate spacer 108, and the CESL 110. Reference is made to FIGS. 7A and 7B. The device 100 is etched through the openings 116A and 116B to remove portions of the CESL 110 at the bottom of the openings 116A and 116B, for example, using a dry etching process, a wet etching process, or a reactive ion etching process. Particularly, this etching process is anisotropic. As a result, portions of the CESL 110 remain over the sidewalls of the gate stacks 106A and 106B after the etching process is finished. Further, this etching process is selective to the CESL 110, and does not (or insignificantly) etch the gate stacks 106A and 106B and the gate spacer 108. Although two separate etching processes are used in the present embodiment to etch the dielectric layer 112 and the CESL 110, in various embodiments, one joint etching process or more than two etching processes may alternatively be used.

Referring now to FIGS. 8A and 8B, at operation 16, method 1100 (FIG. 1A) proceeds to forming a masking layer 120 over the S/D feature 104A in the NFET region 102A while the S/D feature 104B in the PFET region 102B remains exposed via the opening 116B. In various embodiments, the masking layer 120, similar to the etch mask 114, may include a hard mask layer (e.g., having silicon nitride or silicon oxide), a photoresist layer, or a combination thereof. In some embodiments represented by FIGS. 8A and 8B, the top surface of the masking layer 120 is flush with the top surface of the etch mask 114. In other embodiments (not shown), the masking layer 120 may cover portions of the etch mask 114 as well. As will be described below with respect to operation 18, the purpose of the masking layer 120 is to prevent S/D feature 104A from being implanted with gallium ions. As long as that purpose is served, the masking layer 120 can be of any suitable thickness or configuration and can be formed of any suitable masking materials.

Figures 9A, 9B:
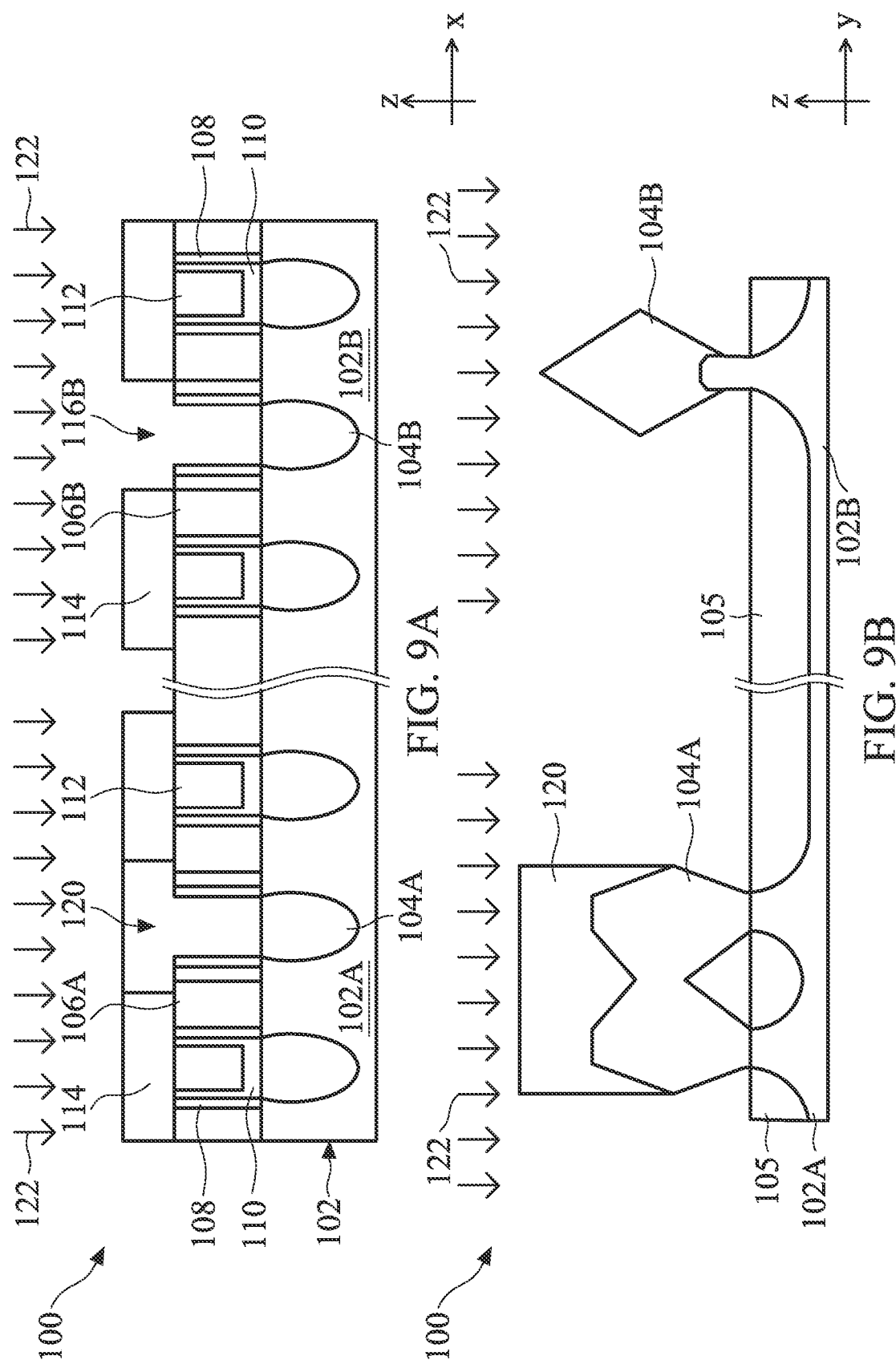
Figure 10A:
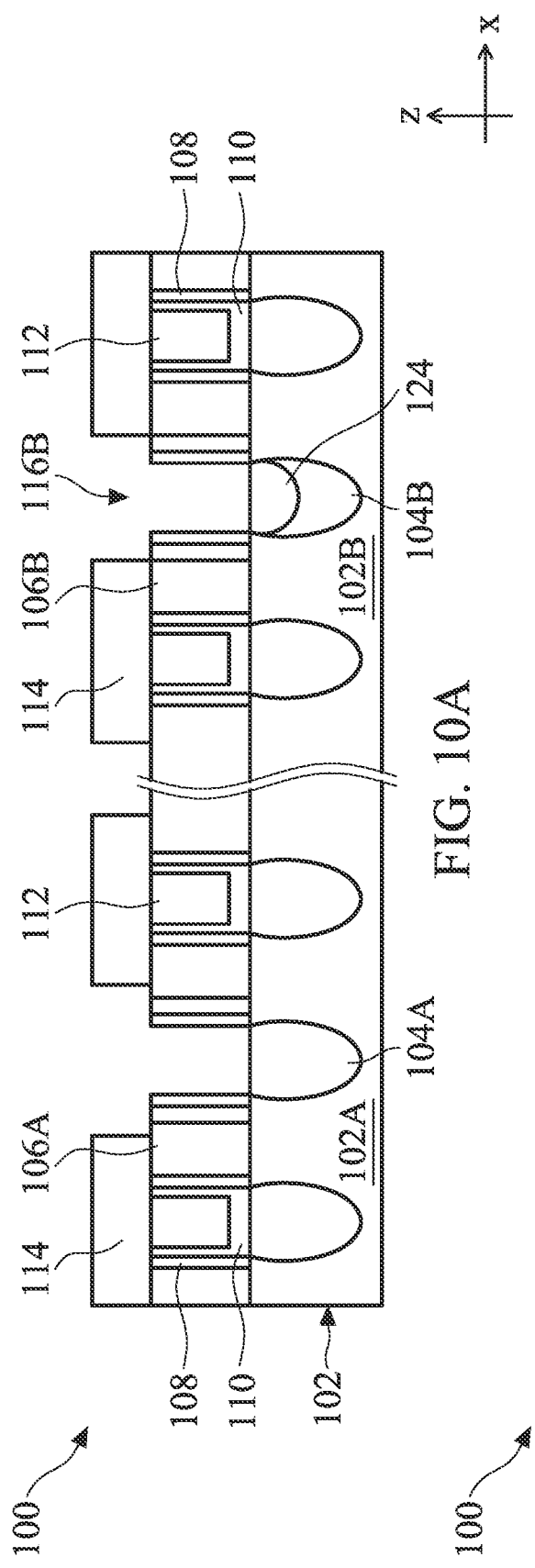
Figure 10B:
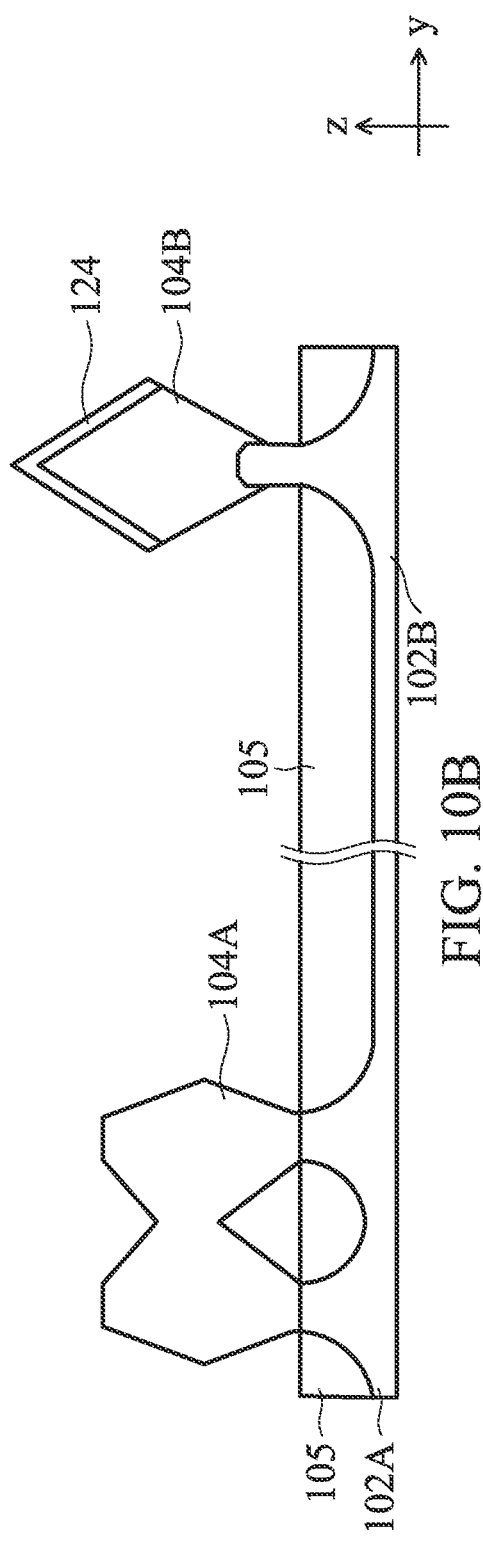

Referring now to FIGS. 9A and 9B, at operation 18, method 1100 (FIG. 1A) implants gallium (Ga) ions alone or together with boron (B) ions into the exposed S/D feature 104B in the PFET region 102B while the S/D feature 104A in the NFET region 102A is masked by the masking layer 120. In some embodiments, the gallium ion implantation at operation 18 is performed with an energy ranging from 1 keV to 10 keV. In some implementations, the gallium ion implantation at operation 18 is performed with a gallium ion dose ranging from $1E15$ $cm^{-2}$ to $1E17$ $cm^{-2}$. In embodiments where boron (B) ions are also implanted at operation 18, boron ion implantation can be performed together or separately. For example, boron ion implantation can be performed first at a doping energy between 1 keV to 5 keV with a boron ion dose ranging from $1E15$ $cm^{-2}$ to $1E16$ $cm^{-2}$. The boron ion implantation is then followed by a gallium ion implantation. In some instances, the gallium ion implantation can be performed at a doping energy ranging from 1 keV to 10 keV with a gallium ion dose ranging from $1E15$ $cm^{-2}$ to $1E17$ $cm^{-2}$. In some implementations, the order of the boron ion implantation and the gallium ion implantation can be reversed, with gallium ion implantation performed first. In some other embodiments, the gallium ion implantation and the boron implantation are performed simultaneously. For example, at operation 18, the S/D feature 104B can be implanted at a doping energy between 1 keV and 10 keV with boron ions at a boron ion dose between $1E15$ $cm^{-2}$ and $1E16$ $cm^{-2}$ and gallium ions at a gallium ion dose between $1E15$ $cm^{-2}$ and $1E17$ $cm^{-2}$. As shown in FIGS. 10A and 10B, operation 18 produces an implant layer 124 in a top portion of the S/D feature 104B while no counterpart is formed in a top portion of the S/D feature 104A as it is masked by the masking layer 120.

At operation 20, method 1100 (FIG. 1A) removes the masking layer 120 over the S/D feature 104A, as shown in FIGS. 10A and 10B. Operation 20 can be accomplished by etching. The etching process may include dry etching, wet etching, reactive ion etching (RIE), and/or other suitable processes.

At operation 22 of method 1100 (FIG. 1A), S/D feature 104B with gallium or gallium and boron dopants is annealed to activate gallium or gallium and boron atoms in the implant layer 124. The operation 22 may select from a variety of annealing processes. For example, the operation 22 may use one or more annealing processes such as microwave annealing (MWA) process, microsecond annealing (OSA) process, rapid thermal annealing (RTA) process, dynamic spike annealing (DSA) process, melting laser annealing (MLA) process, and/or other suitable annealing processes. However, the temperature budget of the operation 22 may take into account the materials of the gate stacks 106A and 106B so as not to damage the gate stacks. The operation 22 can also remove from the S/D feature 104B vacancies, amorphous layers, and crystalline imperfections resulted from the gallium/boron ion implantation.

In some embodiments, the portions of the CESL 110 over the sidewalls of the gate stacks 106A and 106B (referred to as CESL 110 sidewall) may become undesirably thin after the operation 14 finishes. For example, the CESL 110 may have a thin profile to begin with and is partially consumed by the etching process that etches the dielectric layer 112 and CESL 110. One concern with such a thin CESL 110 sidewall is that materials in the gate stacks 106A and 106B and S/D features 104A and 104B might eventually intermix to cause device defects (e.g., shorts). Another concern is the thin CESL sidewall will breakdown during voltage biasing, which eventually leads to shorting the respective S/D feature and the gate stack. In the present embodiment, a protective dielectric layer 118 is formed over the CESL 110 sidewall to increase the thickness of the dielectric layer(s) on the gate stacks 106A and 106B.

Figure 11A:
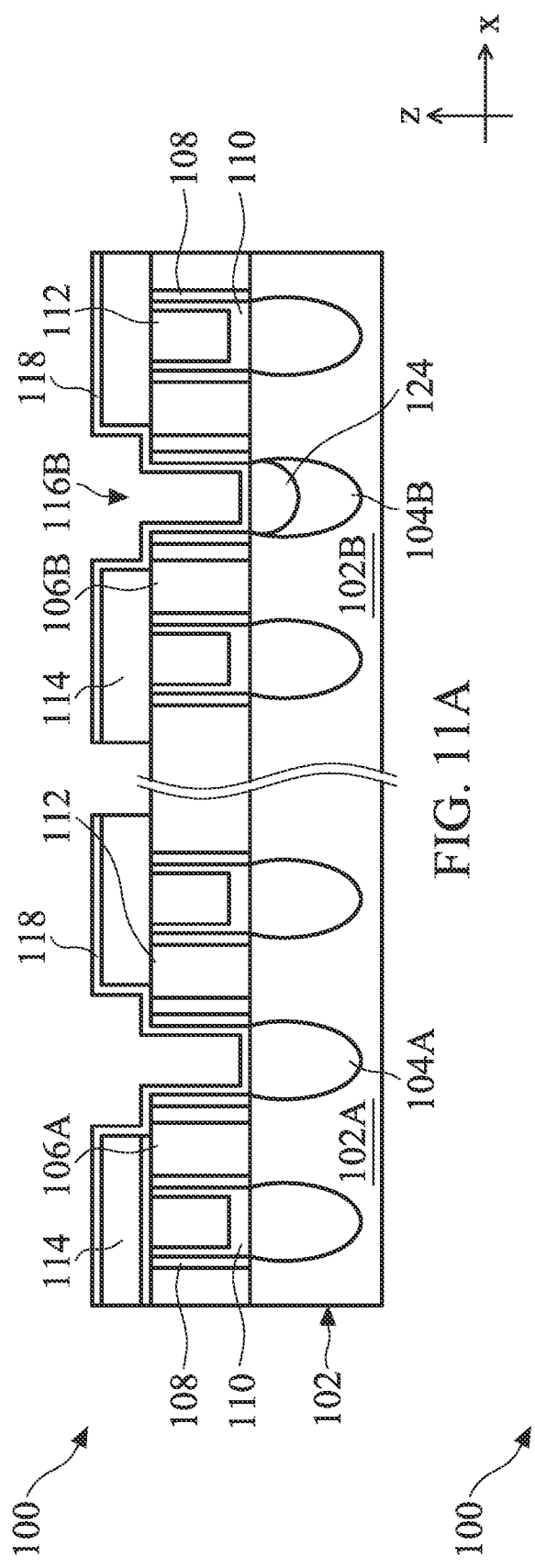
Figure 11B:
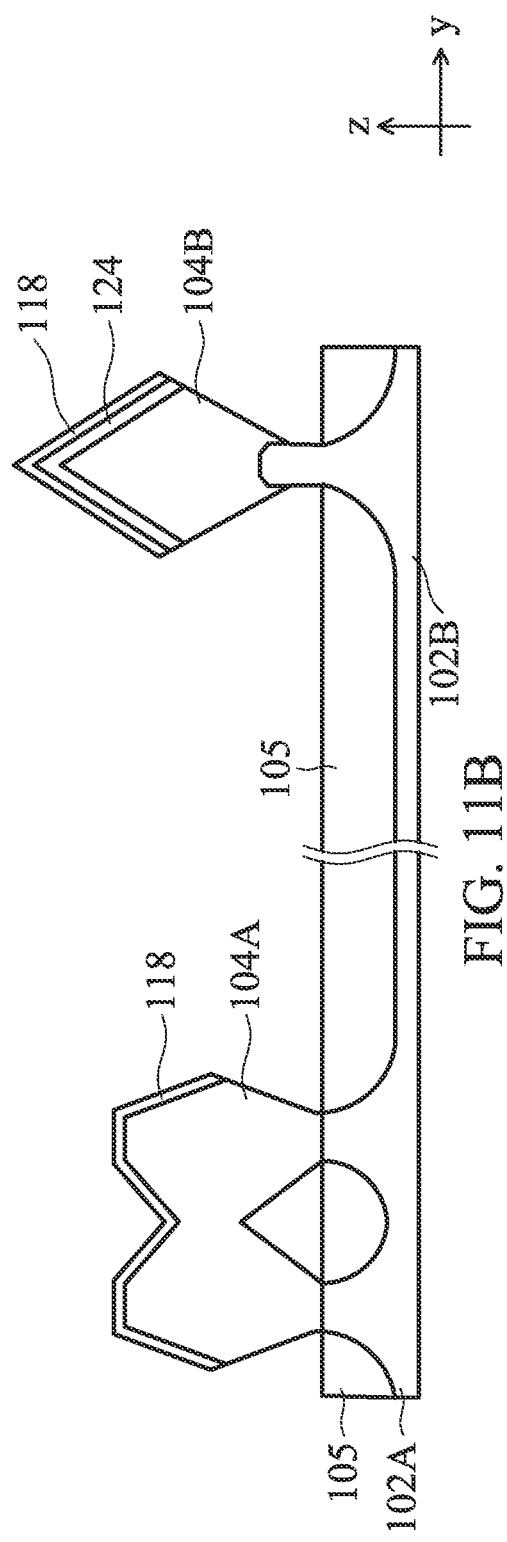

At operation 24, method 1100 (FIG. 1A) forms the protective dielectric layer 118 over the CESL sidewalls in the openings 116 by performing a deposition process and an etching process. Referring to FIGS. 11A and 11B, method 1100 deposits the protective dielectric layer 118 over the device 100, particularly over the sidewalls of the openings 116A and 116B and on top of the S/D features 104A and 104B. In an embodiment, the protective dielectric layer 118 includes silicon nitride. Alternatively, the protective dielectric layer 118 may include silicon oxynitride, silicon carbide nitride, or other suitable material(s). The protective dielectric layer 118 may be deposited using a CVD, PVD, or ALD method. Referring to FIGS. 12A and 12B, method 1100 anisotropically etches the protective dielectric layer 118 at operation 24, leaving portions of the protective dielectric layer 118 over the sidewalls of the openings 116, particularly over the CESL 110 sidewall as a protective layer (sometimes referred to as the protective sidewall 118). The protective sidewall 118 advantageously increases the thickness of the dielectric layer(s) on the sidewalls of the gate stacks 106A and 106B. The etching process is dry etching in an embodiment. In some embodiments of method 1100 where the CESL 110 sidewall has sufficient thickness, the operation 24 can be omitted. After the etching processes of the operation 24, the S/D features 104A, 104B (or portions thereof), and the implant layer 124 are exposed through the openings 116A and 116B as shown in FIGS. 12A and 12B.

In some embodiments, the S/D features 104A and 104B may have been etched during the various etching processes discussed above including the etching of the CESL 110 and the optional etching of the dielectric layer 118. For example, when etching the CESL 110 to expose the S/D features 104A and 104B, some over-etching may be performed to ensure that there is no dielectric residue on the respective S/D features. Otherwise, S/D contact resistance might be undesirably high, or circuit open defects might ensue. However, such over-etching may inadvertently etch the S/D features 104A and 104B. In some embodiments, the S/D features 104A and 104B may be intentionally etched to increase their interfacial area for S/D contact formation. Either the inadvertent over-etching or the intentional etching may alter the structure of the S/D features and impact the device performance. In a particular example, the S/D features 104B include silicon germanium for applying strain (or stress) to the p-type FinFETs, and etching of the S/D features 104B usually relaxes that strain undesirably. In order to reinforce or increase the strain in the S/D features 104B, method 1100 dopes gallium ions into the S/D features 104B according to the present embodiment.

At operation 26, method 1100 (FIG. 1B) performs a selective etching process to the S/D features 104A and 104B. In some embodiments, the operation 26 involves a dry etching process with the use of a process gas mixture of sulfur fluoride ($SF_6$) and oxygen ($O_2$) as the dry etchant. In some other embodiments, the etching process of the operation 26 is a wet etching process with the use of aqueous potassium chloride (KOH) solution as the wet etchant. In these embodiments, as both the SF6/O2 gas mixture and the potassium chloride solution contain some forms of oxygen, they can be collectively referred to as oxygen-containing etchants or oxygen-atom-containing etchants. In some implementations represented in FIGS. 13A and 13B, an oxygen-containing etchant used at operation 26 reacts with gallium atoms in the implant layer 124 and form gallium oxide ($GaO_x$) in the top portion 126 of the implant layer 124, while the bottom portion of the implant layer 124 is substantially free of gallium oxide. The top portion 126 of the implant layer 124, once converted into a gallium oxide containing layer by the chemical reaction with an oxygen-containing etchant, serves as an etch passivation layer that retards the etching of implant layer 124 by the oxygen-containing etchant. This etching retardation provided by gallium oxide prevents loss of strained epitaxial materials in the S/D feature 104B below the implant layer 24. In some embodiments, the strained epitaxial material is doped or undoped silicon germanium (SiGe). In contrast, because no gallium ion is implanted into the S/D feature 104A, the etching rate at which the oxygen-containing etchant etches into the S/D feature 104A is not retarded. Therefore, in these implementations, upon conclusion of operation 26, the S/D feature 104A is recessed more by the etching process than the S/D feature 104B. In some implementations, anisotropic etching of the protective dielectric layer 118 in operation 24 and the selective etching at operation 26 are performed sequentially with non-oxidizing etchants used in operation 24 and oxygen-containing or oxygen-atom-containing etchants used in operation 26. In some other implementations, the selective etching at operation 26 and the anisotropic etching of the protective dielectric layer 118 in operation 24 can be performed together with the same etching chemistry.

More specifically, as shown in FIGS. 13A and 13B, the S/D features 104A are etched (or partially removed) by a vertical distance or depth d1, the S/D features 104B are etched (or partially removed) by a depth d2, and d1 is greater than d2. In an embodiment, d1 may be measured from the lowest point of the upper surface of the etched S/D feature 104A to a bottom surface of an adjacent gate spacer 108 as illustrated in FIG. 13A. Alternatively, d1 may be measured from the lowest point of the upper surface of the etched S/D feature 104A to a corresponding point of the upper surface of an adjacent un-etched S/D feature 104A, where the two points have the same "y" coordinate, but different "x" coordinates, as illustrated in FIG. 13B. FIG. 13B illustrates a "y-z" cross-section of the etched S/D feature 104A overlapping with (in front of) another "y-z" cross-section of an un-etched S/D feature 104A'. The vertical distance between the two points along the "z" direction represents the etching depth into the S/D feature 104A. The depth d2 may be measured similarly. Particularly, FIG. 13B illustrates a "y-z" cross-section of the etched S/D feature 104B overlapping with (in front of) another "y-z" cross-section of an un-etched S/D feature 104B'. The vertical distance between the two points along the "z" direction represents the etching depth into the S/D feature 104B. In various embodiments, the depth d1 is greater than the depth d2 by at least 5 nm. In the NFET region 102A, the greater etching depth into the S/D features 104A generally leads to increased interfacial area for S/D contacts and therefore reduced S/D contact resistance. In the PFET region 102B, the less etching depth into the S/D features 104B helps maintain the stress/strain built into the S/D features 104B. Still further, the etching process at operation 26 is tuned not to etch the gate stacks 106A and 106B, the gate spacer 108, the CESL 110, and the dielectric layer 118. As used herein, a vertical distance refers to a distance along a direction that is vertical to the surface of the substrate 102.

Figure 14A:
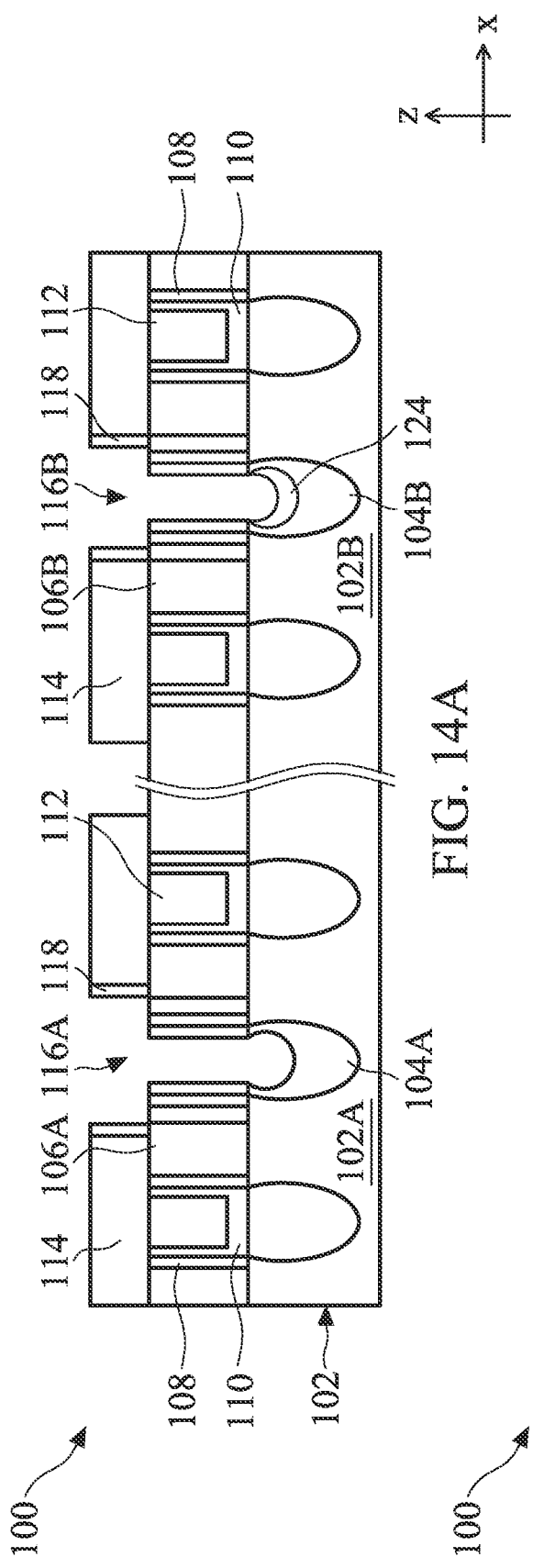
Figure 14B:
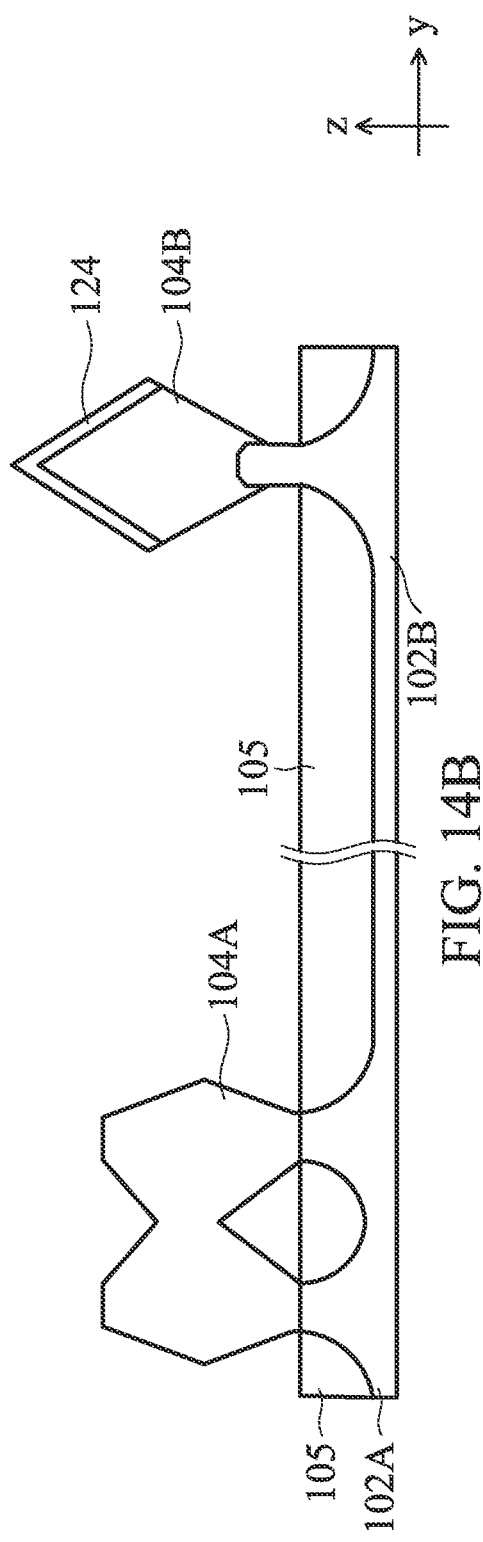

Referring now to FIGS. 14A and 14B, at operation 28, method 1100 (FIG. 1B) clean surfaces of the S/D features 104A and 104B to prepare them for a subsequent silicidation process. In some embodiments, the operation 28 removes the gallium oxide in the top portion 126 of the implant layer 124. The operation 28 can also be referred to as a pre-cleaning operation. The operation 28 may use a dry cleaning process or a wet cleaning process. For example, a dry cleaning process may use SiConi etch, which is a remote plasma assisted dry etch process involving the simultaneous exposure of an object to $H_2$, $NF_3$ and $NH_3$ plasma by-products. For example, a wet cleaning process may involve use of diluted hydrofluoric acid (DHF) solution to clean the surfaces of the S/D features 104A and 104B.

Figure 15A:
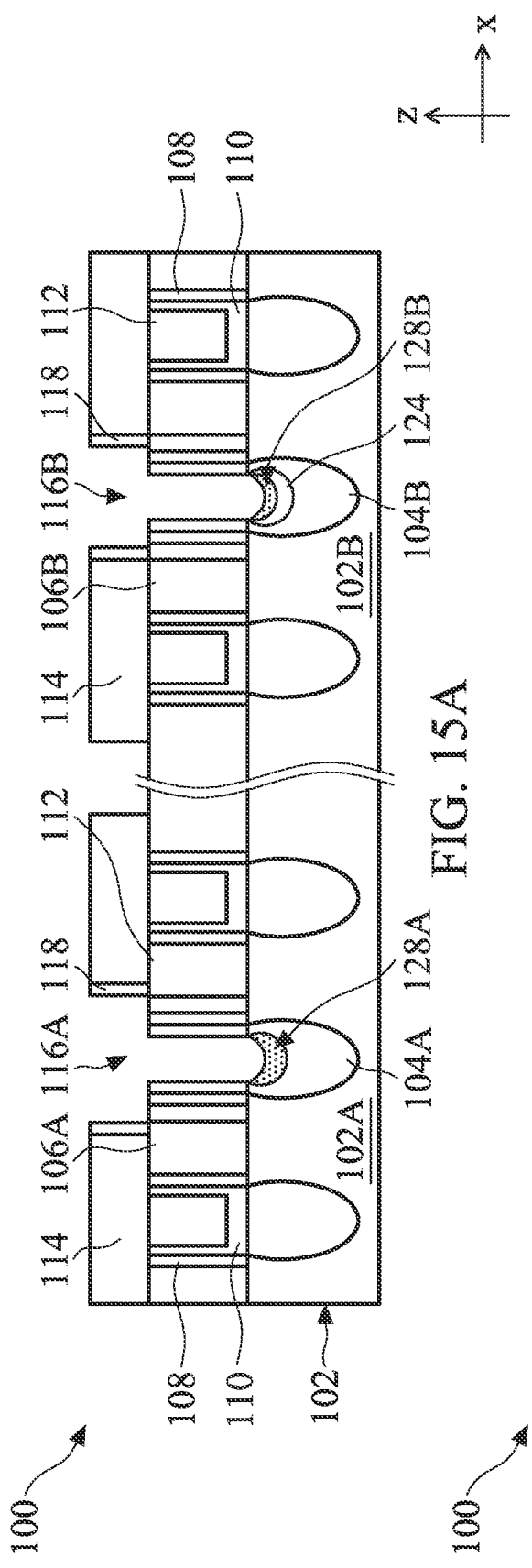
Figure 15B:
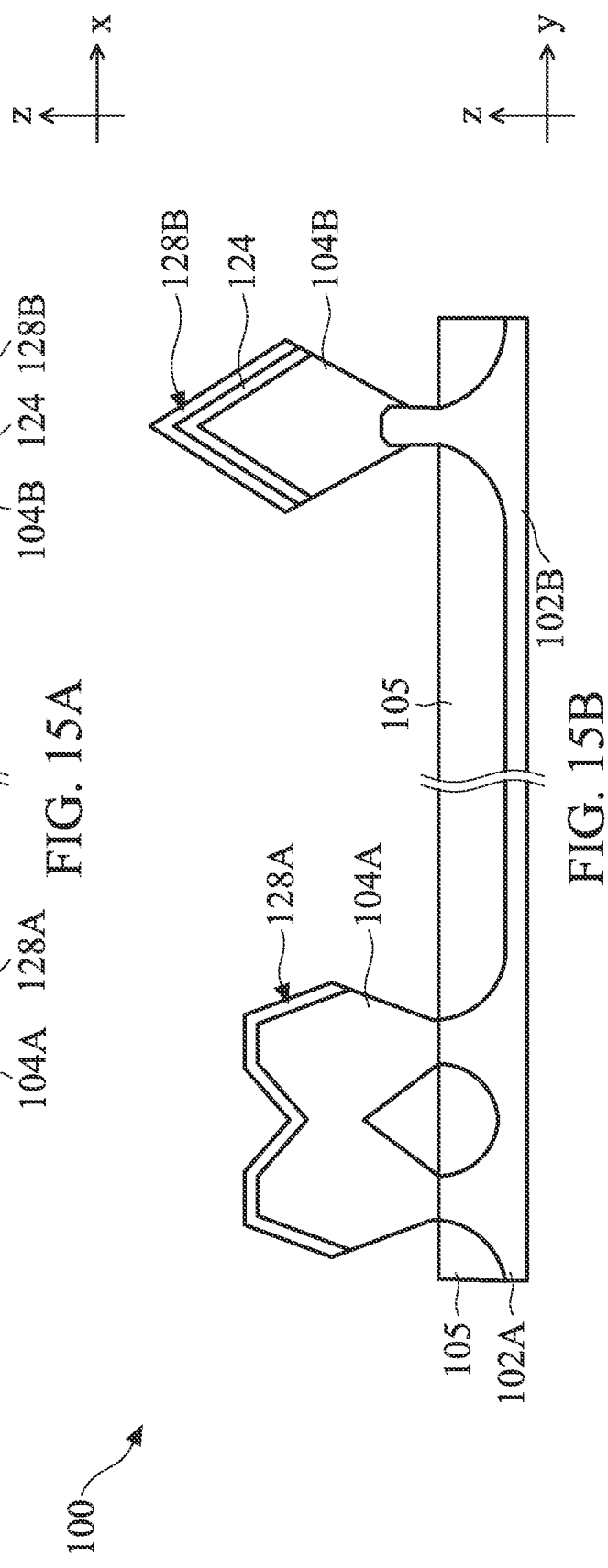

As illustrated by FIGS. 15A and 15B, at operation 30, method 1100 (FIG. 1B) forms silicide features (or silicide layers) 128A and 128B over the S/D features 104A and 104B, respectively, for reducing S/D contact resistance. In an example embodiment, at operation 30, method 1100 deposits a metal layer over the S/D features 104A and 104B, performs an annealing process to cause reaction between the metal layer and the underlying semiconductor material to form metal silicide, and removes excess unreacted metal. The remaining metal silicide becomes the silicide features 128A and 128B, as shown in FIGS. 15A and 15B. For example, the metal layer may have a thickness of about 10 nm or less, such as 5 nm or less. In embodiments, the same metal layer may be used for silicidation of both S/D feature 104A in the NFET region 102A and S/D feature 104B in the PFET region. Alternatively, the metal layer used for silicidation of the S/D features 104A may be different from the metal layer used for silicidation of the S/D features 104B. In various embodiments, the metal layer may include titanium (Ti), nickel (Ni), cobalt (Co), tantalum (Ta), erbium (Er), yttrium (Y), ytterbium (Yb), platinum (Pt), or combinations thereof. In addition, because the S/D features 104A and 104B have different composition, the resulting silicide features 128A and 128B have different compositions.

At operation 32, method 1100 (FIG. 1B) forms S/D contacts 130 over the silicide features 128A and 128B by depositing a metal in the openings 116A and 116B. Referring to FIG. 16A, the S/D contacts 130 fill the openings 116A and 116B and cover the top and side surfaces of the S/D features 104A and 104B through the silicide features 128A and 128B, respectively. In embodiments, the S/D contacts 130 may comprise tungsten (W), cobalt (Co), copper (Cu), other elemental metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In an embodiment, the etch mask 114 is removed before depositing the metal for the contacts 130. Further, a CMP process may be performed to planarize a top surface of the device 100 to obtain the structure as shown in FIG. 16A.

Still referring to FIG. 16A, the bottom surface of the S/D contact 130 in the NFET region 102A is lower than the bottom surface of the S/D contact 130 in the PFET region 102B. This results from the differentiated etching process at the operation 26 due to the presence of gallium oxide in the S/D feature 104B. In the PFET region 102B, the S/D contact 130 is disposed over a multi-layer structure including the p-type S/D feature 104B, the gallium containing implant layer 124, and the silicide feature 128B. Further, the sidewalls of the S/D contacts 130 are sandwiched between the CESL 110, the gate spacer 108, and the gate stacks 106A (in the NFET region 102A) and 106B (in the PFET region 102B).

At operation 34, method 1100 (FIG. 1B) may perform further steps to complete the fabrication of the device 100. For example, operation 34 may include forming a gate contact electrically connecting the gate stacks 106A and 106B, and forming metal interconnects connecting the FinFETs as well as other portions of the device 100 to form a complete IC.

Reference is now made to FIGS. 2A and 2B, which demonstrate a flow chart for method 1200. Method 1200 shares operations 12 and 14 with method 1100. From operation 14, method 1200 continues to operation 15, which is followed by operations 19, 21, 23, 25, and 27. After operation 27, method 1200 continues on to operations 26, 28, 30, 32, and 34. Operations 15, 19, 21, 23, 25, and 27 are described below in conjunction with FIGS. 17A-21B.

Reference is made to FIGS. 17A and 17B. At operation 15, method 1200 (FIG. 2A) deposits the protective dielectric layer 118 over the device 100, particularly over the sidewalls of the openings 116A and 116B and on top of the S/D features 104A and 104B. In an embodiment, the protective dielectric layer 118 includes silicon nitride. Alternatively, the protective dielectric layer 118 may include silicon oxynitride, silicon carbide nitride, or other suitable material(s). The protective dielectric layer 118 may be deposited using a CVD, PVD, or ALD method.

At operation 19, method 1200 (FIG. 2A) proceeds to forming a masking layer 120 over the opening 116A over the S/D feature 104A in the NFET region 102A while the S/D feature 104B in the PFET region 102B remains exposed via the opening 116B. In various embodiments, the masking layer 120, similar to the etch mask 114, may include a hard mask layer (e.g., having silicon nitride or silicon oxide), a photoresist layer, or a combination thereof. In some embodiments represented by FIG. 18A, the top surface of the masking layer 120 is flush with the protective dielectric layer 118 on the top surface of the etch mask 114. In other embodiments (not shown), the masking layer 120 may cover portions of the protective dielectric layer 118 on the etch mask 114 as well. The purpose of the masking layer 120 is to prevent the S/D feature 104A from being implanted with gallium ions. As long as that purpose is served, the masking layer 120 can be of any suitable thickness or configuration and can be formed of any suitable masking materials.

Reference is now made to FIGS. 19A and 19B. At operation 21, method 1200 (FIG. 2A) implants gallium (Ga) ions alone or together with boron (B) ions into the exposed protective dielectric layer 118 and S/D feature 104B in the opening 116B in the PFET region 102B while the protective dielectric layer 118 and S/D feature 104A in the opening 116A in the NFET region 102A is masked by the masking layer 120. In some embodiments, the gallium ion implantation at operation 21 is performed with an energy ranging from 1 keV to 10 keV. In some implementations, the gallium ion implantation at operation 21 is performed with a gallium ion dose ranging from $1E15$ $cm^{-2}$ to $1E17$ $cm^{-2}$. In embodiments where boron (B) ions are also implanted at operation 21, boron ion implantation can be performed together or separately. For example, boron ion implantation can be performed first at a doping energy between 1 keV to 5 keV with a boron ion dose ranging from $1E15$ $cm^{-2}$ to $1E16$ $cm^{-2}$. The boron ion implantation is then followed by a gallium ion implantation. In some instances, the gallium ion implantation can be performed at a doping energy ranging from 1 keV to 10 keV with a gallium ion dose ranging from $1E15$ $cm^{-2}$ to $1E17$ $cm^{-2}$. In some implementations, the order of the boron ion implantation and the gallium ion implantation can be reversed, with gallium ion implantation performed first. In some other embodiments, the gallium ion implantation and the boron implantation are performed simultaneously. For example, at operation 21, the S/D feature 104B and the protective dielectric layer 118 in the opening 116B can be implanted at a doping energy between 1 keV and 10 keV with boron ions at a boron ion dose between $1E15$ $cm^{-2}$ and $1E16$ $cm^{-2}$ and gallium ions at a gallium ion dose between $1E15$ $cm^{-2}$ and $1E17$ $cm^{-2}$. As shown in FIGS. 20A and 20B, operation 21 produces an implant layer 124 in a top portion of the S/D feature 104B and the protective dielectric layer 118 thereon while no counterpart is formed in a top portion of the S/D feature 104A as it is masked by the masking layer 120. The implant layer 124 includes gallium. In some instances, after operation 21, the gallium-containing implant layer 124 extends from the protective dielectric layer 118 over the S/D feature 104B into the top portion of the S/D feature 104B.

At operation 23, method 1200 (FIG. 2A) removes the masking layer 120 over the opening 116A, as shown in FIGS. 20A and 20B. Operation 23 can be accomplished by etching. The etching process may include dry etching, wet etching, reactive ion etching (RIE), and/or other suitable processes.

At operation 25 of method 1200 (FIG. 2A), S/D feature 104B and the protective dielectric layer 118 in the opening 116B, which were implanted with gallium or gallium and boron dopants, are annealed to activate gallium or gallium and boron atoms in the implant layer 124. The operation 25 may select from a variety of annealing processes, including, but not limited to, an MWA process, a μSSA process, an RTA process, a DSA process, an MLA process, and/or other suitable annealing processes. The operation 25 can also remove from the S/D feature 104B and the protective dielectric layer 118 thereon vacancies, amorphous layers, and crystalline imperfections resulted from the gallium/boron ion implantation.

Referring to FIGS. 21A and 21B, at operation 27, method 1200 (FIG. 2A) anisotropically etches the protective dielectric layer 118, leaving portions of the protective dielectric layer 118 over the sidewalls of the openings 116, particularly over the CESL 110 sidewall. In some embodiments, after the etching processes of the operation 27, the S/D features 104A, 104B (or portions thereof), and the implant layer 124 are exposed through the openings 116A and 116B as shown in FIGS. 21A and 21B. In some embodiments, embodiments, operation 27 and operation 26 that follows can be performed sequentially with non-oxidizing etchants used in operation 27 and oxygen-containing or oxygen-atom-containing etchants used in operation 26. In some other embodiments, operation 27 and operation 26 that follows can be performed continuously with oxygen-containing etchants or oxygen-atom-containing etchants, such as a process gas mixture of sulfur fluoride ($SF_6$) and oxygen ($O_2$) or an aqueous potassium chloride (KOH) solution.

Method 1200 (FIG. 2B) continues to operations 26, 28, 30, 32, and 34, which will not be described again for brevity.

Referring now to FIGS. 3A and 3B, shown therein is a flow chart for method 1300. Method 1300 shares operations 12 and 14 with methods 101 and 102. From operation 14, method 1300 continues to operation 17, which is followed by operations 19X, 21X, 23X, and 25X. After operation 25X, method 1300 continues on to operations 26, 28, 30, 32, and 34. Operations 17, 19X, 21X, 23X, and 25X are described below in conjunction with FIGS. 22A-25B.

Figure 22A:
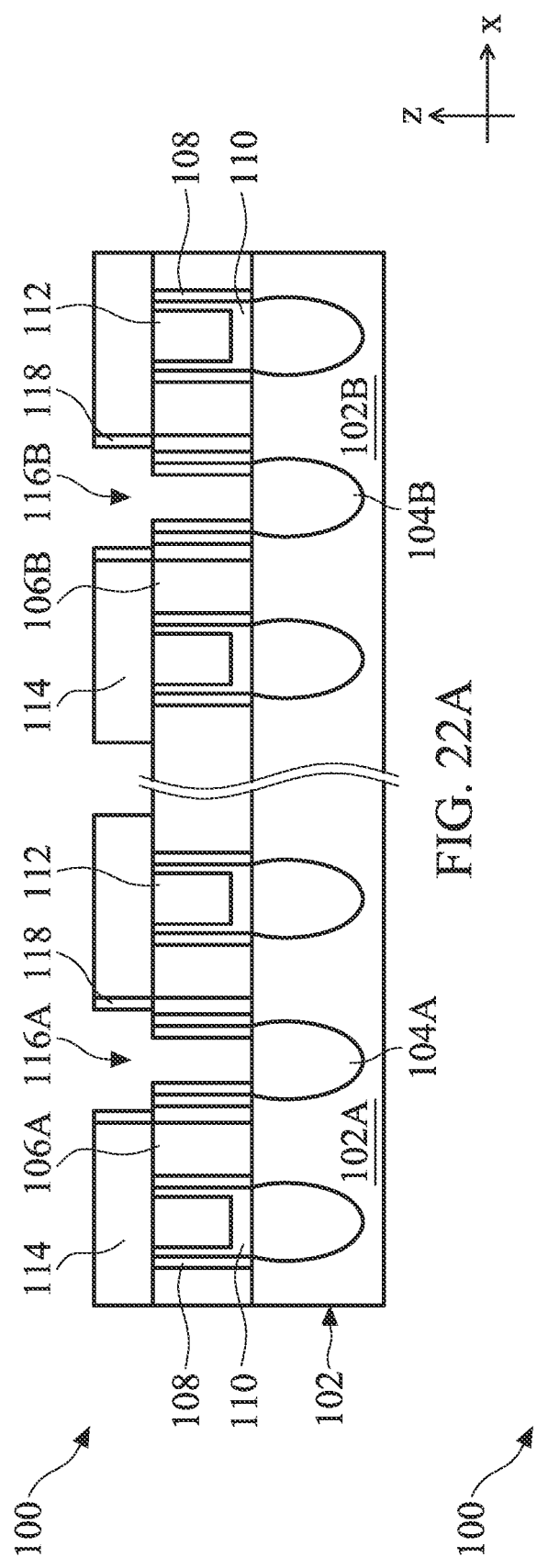
Figure 22B:
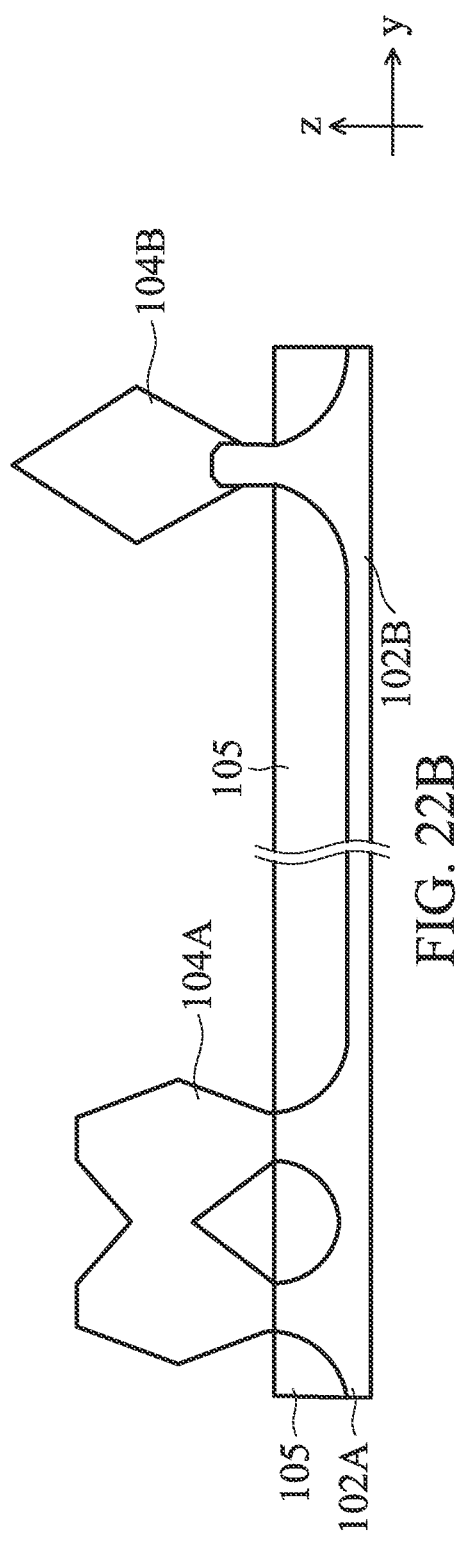

Reference is made to FIGS. 22A and 22B. At operation 17, method 1300 (FIG. 3A) deposits the protective dielectric layer 118 over the device 100, particularly over the sidewalls of the openings 116A and 116B and on top of the S/D features 104A and 104B. In an embodiment, the protective dielectric layer 118 includes silicon nitride. Alternatively, the protective dielectric layer 118 may include silicon oxynitride, silicon carbide nitride, or other suitable material(s). The protective dielectric layer 118 may be deposited using a CVD, PVD, or ALD method. The protective dielectric layer 118 is anisotropically etched, leaving portions of the protective dielectric layer 118 over the sidewalls of the openings 116, particularly over the CESL 110 sidewall. In some embodiments, after the etching processes of the operation 17, the S/D features 104A, 104B (or portions thereof), and the implant layer 124 are exposed through the openings 116A and 116B as shown in FIGS. 22A and 22B.

Reference is now made to FIGS. 23A and 23B. At operation 19X, method 1300 (FIG. 3A) proceeds to forming a masking layer 120 over the opening 116A over the S/D feature 104A in the NFET region 102A while the S/D feature 104B in the PFET region 102B remains exposed via the opening 116B. In various embodiments, the masking layer 120, similar to the etch mask 114, may include a hard mask layer (e.g., having silicon nitride or silicon oxide), a photoresist layer, or a combination thereof. In some embodiments represented by FIG. 23A, the top surface of the masking layer 120 is flush with the top surface of the etch mask 114. In other embodiments (not shown), the masking layer 120 may cover portions of the etch mask 114 as well. The purpose of the masking layer 120 is to prevent the protective dielectric layer 118 covering the S/D feature 104A and S/D feature 104A from being implanted with gallium ions. As long as that purpose is served, the masking layer 120 can be of any suitable thickness or configuration and can be formed of any suitable masking materials.

Reference is now made to FIGS. 24A and 24B. At operation 21X, method 1300 (FIG. 3A) implants gallium (Ga) ions alone or together with boron (B) ions into the exposed S/D feature 104B in the opening 116B in the PFET region 102B while the S/D feature 104A in the opening 116A in the NFET region 102A is masked by the masking layer 120. The implantation doses and doping energy levels adopted in operations can be substantially similar to those described in association with operation 18 above. In embodiments where both gallium and boron ions are implanted, gallium ions can be implanted before, after, or simultaneously with boron ions. As shown in FIGS. 25A and 25B, operation 21X produces an implant layer 124 in a top portion of the S/D feature 104B while no counterpart is formed in a top portion of the S/D feature 104A as it is masked by the masking layer 120.

At operation 23X, method 1300 (FIG. 3A) removes the masking layer 120 over the opening 116A, as shown in FIGS. 25A and 25B. Operation 23X can be accomplished by etching. The etching process may include dry etching, wet etching, reactive ion etching (RIE), and/or other suitable processes.

At operation 25X of method 1300 (FIG. 3A), S/D feature 104B with gallium or gallium and boron dopants, are annealed to activate gallium or gallium and boron atoms in the implant layer 124. The operation 25X may select from a variety of annealing processes, including, but not limited to, an MWA process, a μSSA process, an RTA process, a DSA process, an MLA process, and/or other suitable annealing processes. The operation 25X can also remove from the S/D feature 104B and the protective dielectric layer 118 thereon vacancies, amorphous layers, and crystalline imperfections resulted from the gallium/boron ion implantation.

Method 1300 (FIG. 3B) continues to operations 26, 28, 30, 32, and 34, which will not be described again for brevity.

Although not intended to be limiting, one or more embodiments of the present disclosure provide many benefits to a semiconductor device and a formation process thereof. For example, gallium ion implantation in the S/D feature of the PFET region not only serves as a p-type dopant but also forms an etching retardation layer when the implanted gallium is oxidized by oxygen-atom-containing etchants to form gallium oxide. The gallium oxide containing etching retardation layer prevents excessive removal of strained S/D features, such as SiGe epitaxial features, thereby preventing undesirable release of strain in the S/D feature. The provided subject matter can be easily integrated into existing IC fabrication flow and can be applied to many different process nodes.

In one exemplary aspect, the present disclosure is directed to a method of forming a semiconductor device. The method includes providing a structure that includes a substrate, a first gate structure and a second gate structure over the substrate, a first source/drain (S/D) feature comprising silicon adjacent to the first gate structure, a second S/D feature comprising silicon germanium (SiGe) adjacent to the second gate structure; and one or more dielectric layers over sidewalls of the first and second gate structures and over the first and second S/D features. The method further includes etching the one or more dielectric layers to form openings exposing the first and second S/D features, forming a masking layer over the first S/D feature, implanting gallium (Ga) into the second S/D feature while the masking layer is over the first S/D feature, removing the masking layer; and etching the first and second S/D features with an oxygen-atom-containing etchant.

In some embodiments, the method further includes doping the second S/D feature with boron (B) while the masking layer is over the first S/D feature. In some embodiments, the method further includes before the forming of the masking layer over the first S/D feature, forming a protective dielectric layer over the first and second S/D features. In some implementations, the method further includes annealing the second S/D feature to activate gallium (Ga). In some instances, the method further includes, after annealing the second S/D feature to activate gallium (Ga), forming a protective dielectric layer over sidewalls of the openings exposing the first and second S/D features. In some embodiments, the oxygen-atom-containing etchant is a gas mixture of sulfur fluoride ($SF_6$) and oxygen ($O_2$). In some instances, the oxygen-atom-containing etchant is a potassium hydroxide (KOH) solution. In some embodiments, the implanting of the gallium (Ga) produces a gallium-containing implant layer over the second S/D feature. In some implementations, the etching of the first and second S/D features with the oxygen-atom-containing etchant converts a top portion of the gallium-containing implant layer into a gallium oxide containing layer while a bottom portion of the gallium-containing implant layer remains on the second S/D feature. In some embodiments, the method further includes removing the gallium oxide containing layer. In some other embodiments, the method of the present disclosure further includes after the removing of the gallium oxide containing layer, depositing a metal layer over the first and second S/D features. In some instances, the implanting of the gallium (Ga) uses a doping energy ranging from 1 keV to 10 keV and a doping dose ranging from 1E15 $cm^{-2}$ to 1E17 $cm^{-2}$.

In another exemplary aspect, the present disclosure is directed to a method of forming a semiconductor device. The method includes providing a structure that includes a substrate; a first gate structure and a second gate structure over the substrate; a first source/drain (S/D) feature comprising n-type doped silicon adjacent to the first gate structure; a second S/D feature comprising silicon germanium (SiGe) adjacent to the second gate structure; and one or more dielectric layers over sidewalls of the first and second gate structures and over the first and second S/D features. The method further includes etching the one or more dielectric layers to expose the first and second S/D features; forming a masking layer over the first S/D feature; implanting the second S/D feature with gallium (Ga) while the masking layer is over the first S/D feature, resulting in a gallium-containing implant layer over the second S/D feature; removing the masking layer; etching the first and second S/D features with an oxygen-atom-containing etchant, resulting in conversion of a top portion of the gallium-containing implant layer into a gallium oxide containing layer while a bottom portion of the gallium-containing implant layer remains over the second S/D feature; removing the gallium oxide containing layer; depositing a metal layer over the first S/D feature and the bottom portion of the gallium-containing implant layer over the second S/D feature; and annealing the first and second S/D features.

In some embodiments, the method further includes doping the second S/D feature with boron (B) while the masking layer is over the first S/D feature. In some embodiments, the method includes annealing the second S/D feature to activate gallium (Ga). In some implementations, the oxygen-atom-containing etchant comprises a gas mixture of Sulfur fluoride ($SF_6$) and oxygen ($O_2$) or a potassium hydroxide (KOH) solution. In some implementations, the implanting of the second S/D feature with gallium (Ga) uses a doping energy ranging from 1 keV to 10 keV and a doping dose ranging from 1E15 $cm^{-2}$ to 1E17 $cm^{-2}$.

In yet another exemplary aspect, the present disclosure is directed to a semiconductor device. The semiconductor device includes an n-type FinFET region including a first gate stack, a first gate spacer over sidewalls of the first gate stack, an n-type epitaxial feature in a source/drain (S/D) region of the n-type FinFET region, and a first metal silicide layer over the n-type epitaxial feature. The semiconductor device also includes a p-type FinFET region including a second gate stack, a second gate spacer over sidewalls of the second gate stack, a silicon germanium (SiGe) epitaxial feature in an S/D region of the p-type FinFET region, wherein a top portion of the SiGe epitaxial feature includes gallium, and a second metal silicide layer over the top portion of the SiGe epitaxial feature.

In some embodiments, the silicon germanium (SiGe) epitaxial feature further includes boron (B). In some embodiments, a first vertical distance between a bottom surface of the first gate spacer and a lowest point of an upper surface of the n-type epitaxial feature is greater than a second vertical distance between a bottom surface of the second gate spacer and a lowest point of an upper surface of the silicon germanium (SiGe) epitaxial feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an n-type transistor region including:
   a first gate stack;
   a first gate spacer over sidewalls of the first gate stack;
   an n-type epitaxial feature in a source/drain (S/D) region of the n-type transistor region; and
   a first metal silicide layer over the n-type epitaxial feature; and
   a p-type transistor region including:
   a second gate stack;

a second gate spacer over sidewalls of the second gate stack;

a p-type epitaxial feature in an S/D region of the p-type transistor region;

a dopant-containing implant layer over the p-type epitaxial feature, wherein the dopant-containing implant layer includes a metallic dopant; and a second metal silicide layer over the dopant-containing implant layer, wherein a top surface of the n-type epitaxial feature has a first concave profile, a top surface of the p-type epitaxial feature has a second concave profile, and a lowest point of the first concave profile is below a lowest point of the second concave profile.

2. The semiconductor device of claim 1, wherein the metallic dopant is gallium (Ga).

3. The semiconductor device of claim 1, wherein the p-type epitaxial feature and the dopant-containing implant layer both include silicon germanium (SiGe).

4. The semiconductor device of claim 1, wherein the n-type epitaxial feature is substantially free of the metallic dopant.

5. The semiconductor device of claim 1, wherein the dopant-containing implant layer further includes a non-metallic dopant.

6. The semiconductor device of claim 5, wherein the non-metallic dopant is boron (B).

7. The semiconductor device of claim 1, wherein the first and second metal silicide layers include different metallic elements.

8. The semiconductor device of claim 7, wherein the second metal silicide layer includes the metallic dopant and the first metal silicide layer is substantially free of the metallic dopant.

9. The semiconductor device of claim 1, wherein a first vertical distance between a bottom surface of the first gate spacer and the lowest point of the first concave profile is greater than a second vertical distance between a bottom surface of the second gate spacer and the lowest point of the second concave profile.

10. The semiconductor device of claim 1, wherein the lowest point of the first concave profile is below the lowest point of the second concave profile for at least 5 nm.

11. A semiconductor device, comprising:

a fin protruding from a substrate, the fin having a first source/drain (S/D) region, a second S/D region, and a channel region connecting the first and second S/D regions;

a gate structure over the channel region of the fin;

a first S/D feature comprising silicon germanium (SiGe) disposed in the first S/D region of the fin, wherein a top portion of the first S/D feature is doped with gallium (Ga) and a bottom portion of the first S/D feature is free of Ga;

a second S/D feature disposed in the second S/D region of the fin, wherein the second S/D feature is free of Ga, and wherein in cross-sectional views each along a lengthwise direction of the gate structure, a top surface of the first S/D feature is below a top surface of the second S/D feature;

a metal silicide layer over the top surface of the first S/D feature; and an S/D contact disposed on the metal silicide layer and electrically coupled to the first S/D feature.

12. The semiconductor device of claim 11, wherein in a cross-sectional view along a lengthwise direction of the fin, a top surface of the first S/D feature has a concave profile with a lowest point below a top surface of the fin.

13. The semiconductor device of claim 11, wherein the top portion of the first S/D feature is also doped with boron (B).

14. The semiconductor device of claim 11, further comprising:

a gate spacer layer disposed on sidewalls of the gate structure;

a contact etch stop layer (CESL) disposed on sidewalls of the gate spacer layer; and a protective dielectric layer interposing the CESL and the S/D contact.

15. The semiconductor device of claim 11, wherein in a cross-sectional view along a lengthwise direction of the fin, the top surface of the first S/D feature has a concave profile, and the top surface of the second S/D feature is substantially flat.

16. The semiconductor device of claim 11, wherein in the cross-sectional views each along the lengthwise direction of the gate structure, the top surface of the first S/D feature and the top surface of the second S/D feature each have a rhombus profile.

17. The semiconductor device of claim 11, wherein the second S/D feature includes SiGe.

18. A semiconductor device comprising:

an n-type FinFET region including:
a first gate stack;
a first gate spacer over sidewalls of the first gate stack;
an n-type epitaxial feature in a source/drain (S/D) region of the n-type FinFET region; and
a first metal silicide layer over the n-type epitaxial feature; and a p-type FinFET region including:
a second gate stack;
a second gate spacer over sidewalls of the second gate stack;
a silicon germanium (SiGe) epitaxial feature in an S/D region of the p-type FinFET region, wherein a top portion of the SiGe epitaxial feature includes gallium (Ga); and
a second metal silicide layer over the top portion of the SiGe epitaxial feature, wherein a top surface of the n-type epitaxial feature has a first concave profile, a top surface of the SiGe epitaxial feature has a second concave profile, and a lowest point of the first concave profile is below a lowest point of the second concave profile.

19. The semiconductor device of claim 18, wherein the SiGe epitaxial feature further includes boron (B).

20. The semiconductor device of claim 18, wherein a first vertical distance between a bottom surface of the first gate spacer and the lowest point of the first concave profile is greater than a second vertical distance between a bottom surface of the second gate spacer and the lowest point of the second concave profile.

* * * * *